United States Patent
Yamakawa et al.

(10) Patent No.: US 7,138,888 B2
(45) Date of Patent: Nov. 21, 2006

(54) FILTER USING PIEZOELECTRIC RESONATOR

(75) Inventors: Takehiko Yamakawa, Suita (JP);
Hiroshi Yamaguchi, Katano (JP);
Hiroshi Nakatsuka, Katano (JP);
Hiroyuki Nakamura, Katano (JP);
Keiji Onishi, Settsu (JP); Toshio Ishizaki, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 63 days.

(21) Appl. No.: 10/984,839

(22) Filed: Nov. 10, 2004

(65) Prior Publication Data

US 2005/0110596 A1    May 26, 2005

(30) Foreign Application Priority Data

Nov. 20, 2003   (JP)   ............... 2003-391110

(51) Int. Cl.
*H03H 9/00*   (2006.01)
(52) U.S. Cl. .............. 333/133; 333/187; 333/193
(58) Field of Classification Search ............... 333/133, 333/189, 193, 195
See application file for complete search history.

(56) References Cited

U.S. PATENT DOCUMENTS

| | | | | |
|---|---|---|---|---|
| 5,905,418 A * | 5/1999 | Ehara et al. | ............ | 333/193 |
| 6,137,380 A * | 10/2000 | Ushiroku et al. | ........ | 333/193 |
| 6,369,672 B1 * | 4/2002 | Ikada | ............ | 333/193 |
| 6,489,863 B1 * | 12/2002 | Taniguchi | ........ | 333/193 |
| 6,885,260 B1 * | 4/2005 | Nishimura et al. | ........ | 333/133 |
| 6,903,631 B1 * | 6/2005 | Kushitani et al. | ........ | 333/193 |
| 6,909,338 B1 * | 6/2005 | Omote | ............ | 333/133 |
| 6,919,777 B1 * | 7/2005 | Taniguchi et al. | ........ | 333/133 |
| 6,972,641 B1 * | 12/2005 | Huynh | ............ | 333/133 |
| 6,985,052 B1 * | 1/2006 | Tikka | ............ | 333/189 |
| 7,042,312 B1 * | 5/2006 | Sul et al. | ............ | 333/187 |
| 2005/0057323 A1 * | 3/2005 | Kando | ............ | 333/141 |

FOREIGN PATENT DOCUMENTS

JP     2800905    7/1998

* cited by examiner

*Primary Examiner*—Dean Takaoka
(74) *Attorney, Agent, or Firm*—Wenderoth, Lind & Ponack, L.L.P.

(57) ABSTRACT

A series piezoelectric resonator is connected in series between an input terminal and an output terminal. A first electrode of a first parallel piezoelectric resonator is connected to a connection point between the input terminal and the series piezoelectric resonator, and a second electrode of the first parallel piezoelectric resonator is connected to a first terminal of a first inductor. A first electrode of a second parallel piezoelectric resonator is connected to a connection point between the series piezoelectric resonator and the output terminal, and a second electrode of the second parallel piezoelectric resonator is connected to a first terminal of a second inductor. Second terminals of the first and second inductors are grounded. An additional piezoelectric resonator is connected between the second electrode of the first parallel piezoelectric resonator and the second electrode of the second parallel piezoelectric resonator.

13 Claims, 28 Drawing Sheets

FILTER USING PIEZOELECTRIC RESONATOR

BACKGROUND OF THE INVENTION

1. Field of the Invention

The present invention relates to a filter using piezoelectric resonators, and in particular to a filter using piezoelectric resonators to be used in wireless circuits of mobile communication terminals such as mobile phones and wireless LANs.

2. Description of the Background Art

As to the components to be incorporated in mobile phones, wireless LANs, and the like, there is a need for a further reduction in size and weight and improved performance. As one of the components which meet such a need, there exists a filter using piezoelectric resonators composed of a piezoelectric material (see Japanese Patent No. 2800905). An example of the filter will be described below with reference to drawings.

Before describing the configuration of the filter, first, the structure of a piezoelectric resonator used in the filter will be described. FIG. 21 is a perspective view showing the basic structure of a piezoelectric resonator. FIG. 22 is a cross-sectional view taken along line B—B of FIG. 21. FIG. 23A is a diagram showing a circuit symbol of the piezoelectric resonator and FIG. 23B is an equivalent circuit diagram of the piezoelectric resonator. FIG. 24 is a diagram showing the frequency characteristics of the piezoelectric resonator.

As shown in FIG. 21, a piezoelectric resonator 210 is constructed such that an upper electrode layer 211, a piezoelectric material layer 212, a lower electrode layer 213, an insulating material layer 214, and a cavity 215 are formed on/in a substrate 216 such as silicon or glass. The cavity 215 is provided in the substrate 216 so as not to penetrate through the substrate 216. The insulating material layer 214 made of silicon dioxide ($SiO_2$), silicon nitride ($Si_3N_4$), or the like is formed on the substrate 216 so as to cover the cavity 215. On the insulating material layer 214, there is formed the lower electrode layer 213 made of molybdenum (MO), aluminum (Al), silver (Ag), tungsten (W), platinum (Pt), or the like. On the lower electrode layer 213, there is formed the piezoelectric material layer 212 made of aluminum nitride (AlN), zinc oxide (ZnO), lithium niobate ($LiNbO_3$), lithium tantalite ($LiTaO_3$), potassium niobate ($KNbO_3$), or the like. On the piezoelectric material layer 212, there is formed the upper electrode layer 211 made of the same material as the lower electrode layer 213. The upper electrode layer 211, the piezoelectric material layer 212, the lower electrode layer 213, and the insulating material layer 214 make up a vibrating portion 218. As such, the vibrating portion 218 is supported by a supporting portion 221 of the substrate 216, as shown in FIG. 22. The cavity 215 is provided to trap therein a mechanical vibration generated by the piezoelectric material layer 212.

By applying a voltage between the upper electrode layer 211 and the lower electrode layer 213, an electric field is generated in the piezoelectric material layer 212, a distortion caused by the electric field excites a mechanical vibration, and by the mechanical vibration, electrical characteristics having a resonance point and an anti-resonance point are obtained. The resonance frequency $f_r$ and anti-resonance frequency $f_a$ of the piezoelectric resonator 210 can be determined by the thickness and size of the layers of the vibrating portion 218 and parameters such as a constant of each material. The equivalent circuit of the piezoelectric resonator 210 shown in FIG. 23A is represented by a capacitance $C_0$, an equivalent constant $C_1$, an equivalent constant $L_1$, as shown in FIG. 23B. Note that a resistance component is very small and thus is omitted in the equivalent circuit of FIG. 23B. Assuming that the capacitance $C^0$ is present between the upper electrode layer 211 and the lower electrode layer 213, the capacitance $C_0$ can be determined by the following equation (1):

$$C_0 = \epsilon_0 \epsilon_r \times S/d \quad (1)$$

where $\epsilon_0$ is the permittivity of vacuum, $\epsilon_r$ is the relative permittivity of the piezoelectric material, S is the electrode area, and d is the thickness of the piezoelectric material.

In the equivalent circuit of FIG. 23B, based on a series resonance where impedance becomes zero and a parallel resonance where impedance becomes infinite, the resonance frequency $f_r$ and the anti-resonance frequency $f_a$ can be determined by the following equations (2) and (3), respectively:

$$f_r = 1/(2\pi \times \sqrt{(C_1 L_1)}) \quad (2), \text{ and}$$

$$f_a = f_r \times \sqrt{(1 + C_1/C_0)} \quad (3).$$

The frequency characteristics of the piezoelectric resonator 210 are shown in FIG. 24.

FIG. 25 is a diagram showing an exemplary circuit diagram of a conventional filter using three piezoelectric resonators having the above-described frequency characteristics. In FIG. 25, a conventional filter 250 includes a series piezoelectric resonator 251, parallel piezoelectric resonators 252a and 252b, and inductors 253a and 253b. The series piezoelectric resonator 251 is connected in series between an input terminal 255a and an output terminal 255b. A first electrode of the parallel piezoelectric resonator 252a is connected to a connection point between the input terminal 255a and the series piezoelectric resonator 251, and a second electrode of the parallel piezoelectric resonator 252a is connected to a first terminal of the inductor 253a. A first electrode of the parallel piezoelectric resonator 252b is connected to a connection point between the series piezoelectric resonator 251 and the output terminal 255b, and a second electrode of the parallel piezoelectric resonator 252b is connected to a first terminal of the inductor 253b. Second terminals of the inductors 253a and 253b are grounded.

The conventional filter 250 having the above-described configuration has two types of frequency characteristics, i.e., the frequency characteristics of the parallel piezoelectric resonators 252a and 252b (solid line in graph (a) of FIG. 26) and the frequency characteristics of the series piezoelectric resonator 251 (dashed line in graph (a) of FIG. 26). Therefore, by setting each parameter of the filter 250 such that an anti-resonance point 262 of the parallel piezoelectric resonators 252a and 252b substantially corresponds with a resonance point 263 of the series piezoelectric resonator 251, a filter having a passband 265, as shown in graph (b) of FIG. 26, can be realized.

The above-described conventional filter, however, would not be able to obtain a large amount of attenuation in frequency bands before and after the passband, due to the configuration of the filter. Thus, this filter cannot be used in apparatuses, typically mobile communication terminals such as mobile phones and wireless LANs, in which one of two frequency bands needs to be passed while the other frequency band needs to be attenuated. For example, a reception filter for W-CDMA has a reception band of 2.11 to 2.17 GHz and a transmission band of 1.92 to 1.98 GHz.

In addition, in the above-described conventional filter configuration, it is necessary to provide inductors having high values between the parallel piezoelectric resonators and the ground, which necessitates an additional external circuit such as a substrate, causing an increase in the size of the filter.

SUMMARY OF THE INVENTION

Therefore, an object of the present invention is to provide a filter using piezoelectric resonators which is capable of minimizing a loss in the passband while obtaining a desired amount of attenuation in the attenuation band. In addition, another object of the present invention is to provide a filter using piezoelectric resonators which achieves a reduction in size by reducing the value or number of inductors necessary for the circuit.

The present invention is directed to a filter including a plurality of piezoelectric resonators. To attain the object mentioned above, the filter of the present invention comprises: a series piezoelectric resonator part including at least one series piezoelectric resonator connected in series between input and output terminals; a parallel piezoelectric resonator part including at least two parallel piezoelectric resonators each having a first electrode and a second electrode, the parallel piezoelectric resonators being connected, via the first electrodes, in parallel to the series piezoelectric resonator and in a ladder configuration; an inductor part including inductors provided to at least two of the parallel piezoelectric resonators, respectively, the inductors each connecting between a ground and the second electrode of the parallel piezoelectric resonator; and an additional piezoelectric resonator part including at least one additional piezoelectric resonator which connects between any two second electrodes of the parallel piezoelectric resonators having the inductors connected thereto.

A typical filter configuration may be such that the series piezoelectric resonator part includes a series piezoelectric resonator having a first electrode and a second electrode, and being connected in series between the input and output terminals, the parallel piezoelectric resonator part includes: a first parallel piezoelectric resonator having a first electrode and a second electrode, the first electrode being connected to the first electrode of the series piezoelectric resonator; and a second parallel piezoelectric resonator having a first electrode and a second electrode, the first electrode being connected to the second electrode of the series piezoelectric resonator, the inductor part includes: a first inductor connecting between the second electrode of the first parallel piezoelectric resonator and the ground; and a second inductor connecting between the second electrode of the second parallel piezoelectric resonator and the ground, and the additional piezoelectric resonator part includes an additional piezoelectric resonator connecting between the second electrode of the first parallel piezoelectric resonator and the second electrode of the second parallel piezoelectric resonator. In this configuration, it is preferable that the number of the series piezoelectric resonators be equal to the number of the additional piezoelectric resonators.

Another typical filter configuration may be such that the series piezoelectric resonator part includes a first series piezoelectric resonator and a second series piezoelectric resonator which are connected in series between the input and output terminals, the first and second series piezoelectric resonators each having a first electrode and a second electrode, the parallel piezoelectric resonator part includes: a first parallel piezoelectric resonator having a first electrode and a second electrode, the first electrode being connected to the first electrode of the first series piezoelectric resonator; a second parallel piezoelectric resonator having a first electrode and a second electrode, the first electrode being connected between the second electrode of the first series piezoelectric resonator and the first electrode of the second series piezoelectric resonator; a third parallel piezoelectric resonator having a first electrode and a second electrode, the first electrode being connected to the second electrode of the second series piezoelectric resonator, the inductor part includes: a first inductor connecting between the second electrode of the first parallel piezoelectric resonator and the ground; and a second a second inductor connecting between the second electrode of the third parallel piezoelectric resonator and the ground, and the additional piezoelectric resonator part includes an additional piezoelectric resonator connecting between the second electrode of the first parallel piezoelectric resonator and the second electrode of the third parallel piezoelectric resonator. In this configuration, it is preferable that a plurality of the first and second series piezoelectric resonators and a plurality of the additional piezoelectric resonators be provided to share the same state of oddity or evenness in numbers.

Still another typical filter configuration may be such that the series piezoelectric resonator part includes a first series piezoelectric resonator, a second series piezoelectric resonator, and a third series piezoelectric resonator which are connected in series between the input and output terminals, the first, second, and third series piezoelectric resonators each having a first electrode and a second electrode, the parallel piezoelectric resonator part includes: a first parallel piezoelectric resonator having a first electrode and a second electrode, the first electrode being connected to the first electrode of the first series piezoelectric resonator; a second parallel piezoelectric resonator having a first electrode and a second electrode, the first electrode being connected between the second electrode of the first series piezoelectric resonator and the first electrode of the second series piezoelectric resonator; a third parallel piezoelectric resonator having a first electrode and a second electrode, the first electrode being connected between the second electrode of the second series piezoelectric resonator and the first electrode of the third series piezoelectric resonator; and a fourth parallel piezoelectric resonator having a first electrode and a second electrode, the first electrode being connected to the second electrode of the third series piezoelectric resonator, the inductor part includes: a first inductor connecting between the second electrode of the first parallel piezoelectric resonator and the ground; a second inductor connecting between the second electrode of the second parallel piezoelectric resonator and the ground; a third inductor connecting between the second electrode of the third parallel piezoelectric resonator and the ground; and a fourth inductor connecting between the second electrode of the fourth parallel piezoelectric resonator and the ground, and the additional piezoelectric resonator part includes: a first additional piezoelectric resonator connecting between the second electrode of the first parallel piezoelectric resonator and the second electrode of the n-th parallel piezoelectric resonator, where n is one of the numbers 2, 3, and 4; and a second additional piezoelectric resonator connecting between any two second electrodes of the parallel piezoelectric resonators other than the first and n-th parallel piezoelectric resonators.

In this filter configuration, the series piezoelectric resonator, the parallel piezoelectric resonators, and the additional piezoelectric resonator may be thin-film acoustic wave resonators. The thin-film acoustic wave resonators each may include an upper electrode; a lower electrode; a piezoelectric material layer sandwiched between the upper and lower electrodes; and a cavity provided under the lower electrode. Alternatively, in the case where a cavity is not provided in the thin-film acoustic wave resonator, the thin-film acoustic wave resonators each may include an upper electrode; a lower electrode; a piezoelectric material layer sandwiched between the upper and lower electrodes; and an acoustic multilayer film provided under the lower electrode, the acoustic multilayer film being formed by alternately stacking a low impedance layer and a high impedance layer. It is preferable that connections between the electrodes of the series piezoelectric resonator, the parallel piezoelectric resonators, and the additional piezoelectric resonator and the electrodes of their respective adjacent piezoelectric resonators in an equivalent circuit be established in the same wiring layer.

Further, the series piezoelectric resonator, the parallel piezoelectric resonators, and the additional piezoelectric resonator may be surface acoustic wave resonators. The surface acoustic wave resonators each may include a piezoelectric substrate; an interdigital transducer electrode; and a reflector electrode, wherein the interdigital transducer electrode and the reflector electrode are arranged on the piezoelectric substrate so as to be close to each other with respect to a propagation direction.

As described above, according to the filter using piezoelectric resonators of the present invention, at least one additional piezoelectric resonator is inserted between any two second electrodes of the parallel piezoelectric resonators. By this, while maintaining minimization of pass loss in the passband and an increase in bandwidth, a desired amount of attenuation can be obtained in the attenuation band.

These and other objects, features, aspects and advantages of the present invention will become more apparent from the following detailed description of the present invention when taken in conjunction with the accompanying drawings.

DESCRIPTION OF THE PREFERRED EMBODIMENTS

The characteristic configuration provided by the present invention can be applied to any filter regardless of the number of piezoelectric resonators included in the filter, as long as the filter is of a ladder-type having three or more piezoelectric resonators which include one series piezoelectric resonator inserted in series between signal input and output terminals; and two parallel piezoelectric resonators inserted in parallel with the signal input and output terminals. The present invention will be described below using an example of a ladder filter having three piezoelectric resonators which include one series piezoelectric resonator and two parallel piezoelectric resonators.

First Embodiment

Figure 1:
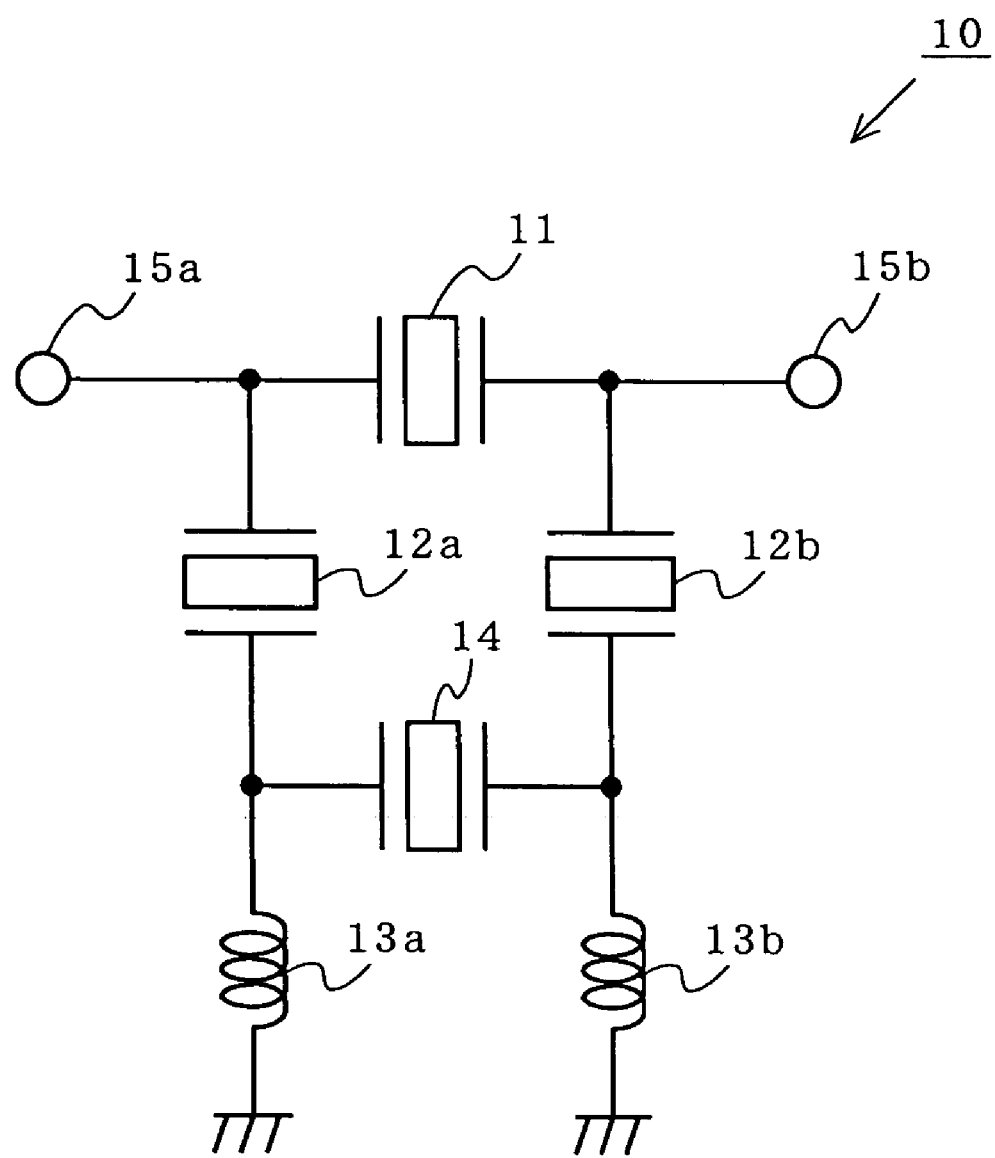
FIG. 1 is a circuit diagram of a filter 10 using piezoelectric resonators, according to a first embodiment of the present invention.

FIG. 1 is a circuit diagram of a filter 10 using piezoelectric resonators, according to a first embodiment of the present invention. In FIG. 1, the filter 10 of the first embodiment includes a series piezoelectric resonator 11, parallel piezoelectric resonators 12a and 12b, inductors 13a and 13b, and an additional piezoelectric resonator 14.

The series piezoelectric resonator 11 is connected in series between an input terminal 15a and an output terminal 15b. A first electrode of the parallel piezoelectric resonator 12a is connected to a connection point between the input terminal 15a and the series piezoelectric resonator 11, and a second electrode of the parallel piezoelectric resonator 12a is connected to a first terminal of the inductor 13a. A first electrode of the parallel piezoelectric resonator 12b is connected to a connection point between the series piezoelectric resonator 11 and the output terminal 15b, and a second electrode of the parallel piezoelectric resonator 12b is connected to a first terminal of the inductor 13b. Second terminals of the inductors 13a and 13b are grounded. The additional piezoelectric resonator 14 is connected between the second electrode of the parallel piezoelectric resonator 12a and the second electrode of the parallel piezoelectric resonator 12b.

Figure 2:
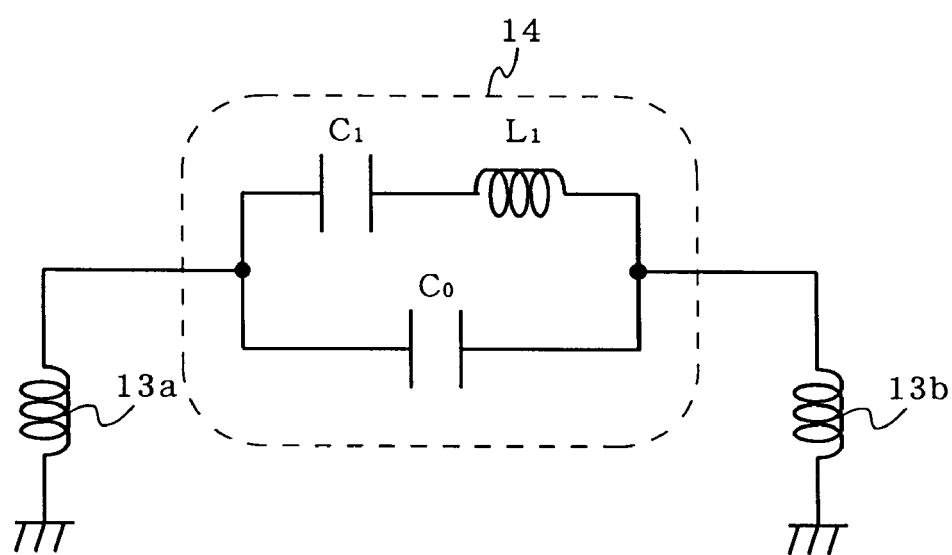
FIG. 2 is an equivalent circuit diagram of an additional piezoelectric resonator 14 to be added.
Figure 25:
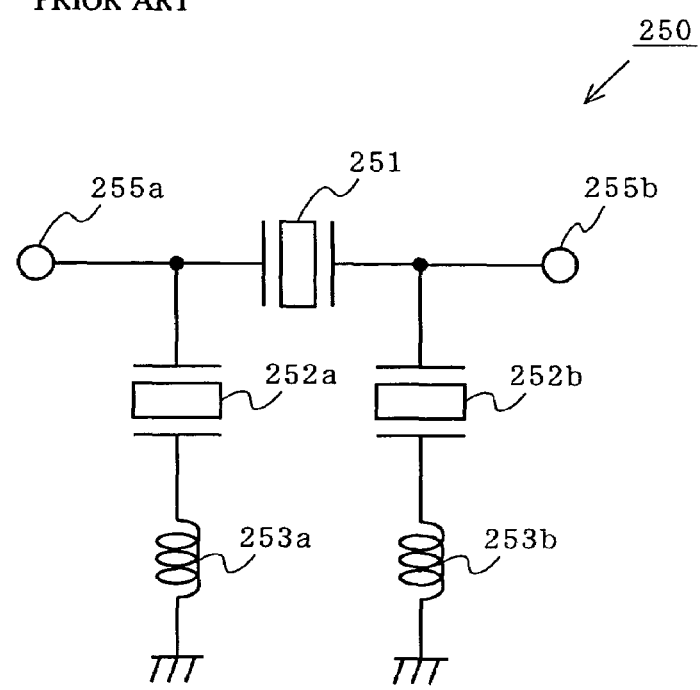
FIG. 25 is a circuit diagram of a filter 250 using conventional piezoelectric resonators.

By connecting the additional piezoelectric resonator 14 as shown in FIG. 1, an equivalent circuit of a series network shown in FIG. 2 is added to the conventional circuit shown in FIG. 25. The resonance frequency $f_r$ and anti-resonance frequency $f_a$ of the equivalent circuit of FIG. 2 can be similarly determined by the above-described equations (2) and (3). In this case, however, the influence of the inductors 13a and 13b needs to be taken into account, and thus the resonance frequency $f_o$ is lower than the resonance frequency $f_r$. That is, by appropriately controlling the resonance frequency $f_o$, the attenuation band can be provided at any desired location.

Figure 3:
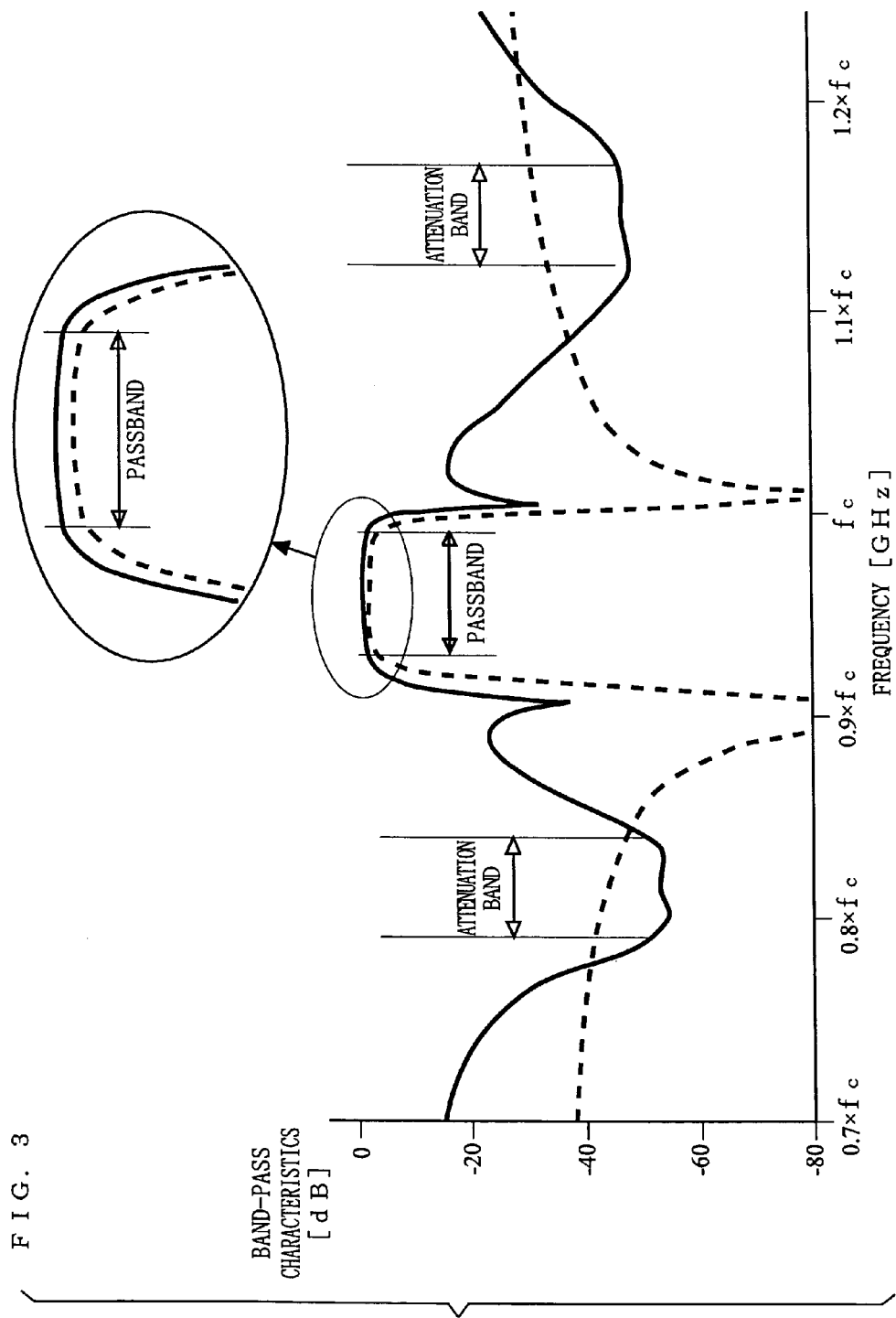
FIG. 3 is a diagram showing the band-pass characteristics of the filter 10.
Figure 26:
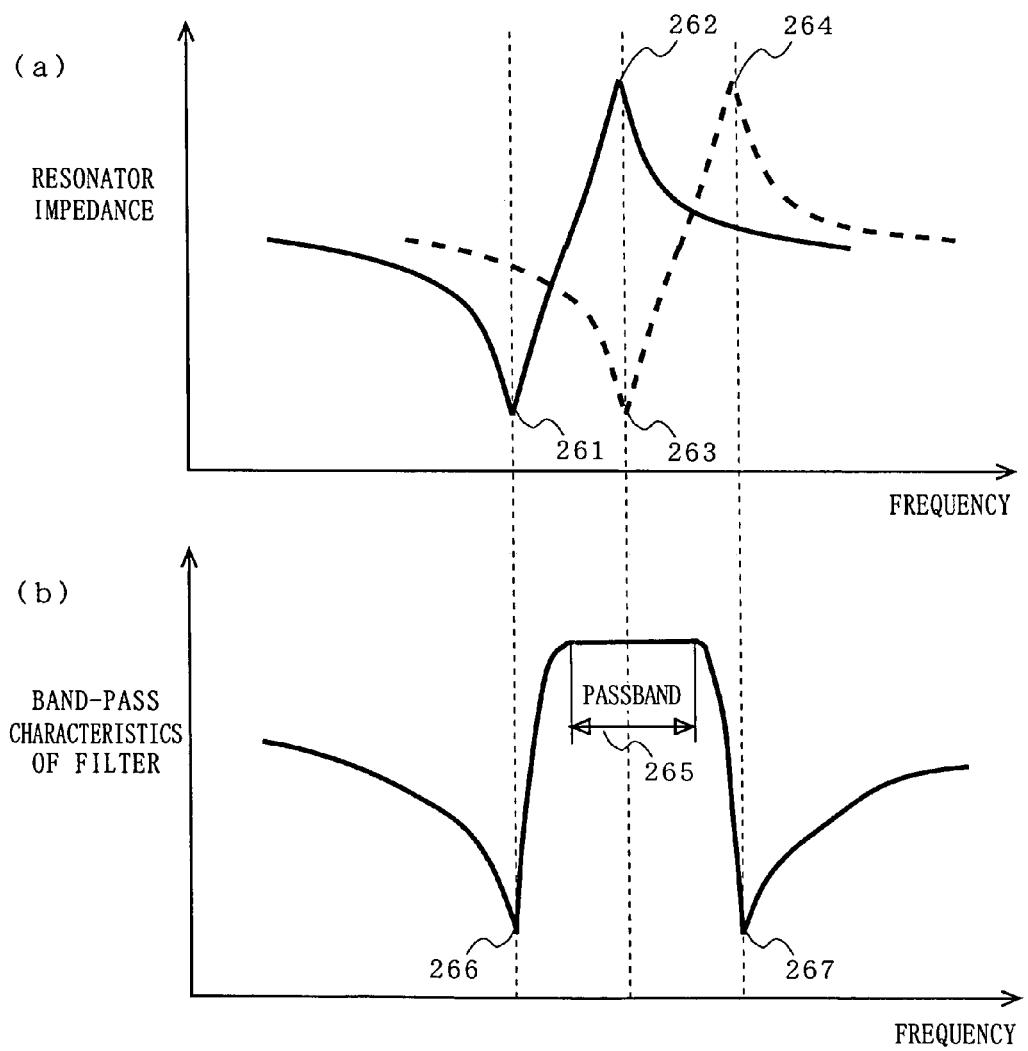
FIG. 26 is a diagram showing the band-pass characteristics of the filter 250.

FIG. 3 is a diagram showing the band-pass characteristics (solid line) of the filter 10 shown in FIG. 1 and the band-pass characteristics (dashed line) of the conventional filter 250 shown in FIG. 26. The band-pass characteristics of the filter 10 are such that the resonance frequency of the additional piezoelectric resonator 14 is adjusted and thus a sufficient amount of attenuation is obtained in desired frequency bands (attenuation bands).

As described above, in the filter 10 using piezoelectric resonators, according to the first embodiment of the present invention, an additional piezoelectric resonator is inserted between any two second electrodes of the parallel piezoelectric resonators. By this, while obtaining a desired amount of attenuation in the attenuation-band, the passband width of the filter can be increased, whereby a loss in the passband can be improved compared to the conventional filter 250. Accordingly, the filter of the present invention having the above-described configuration can be used as a reception filter or a transmission filter of mobile communication terminals, such as mobile phones and wireless LANs.

Figure 4A:
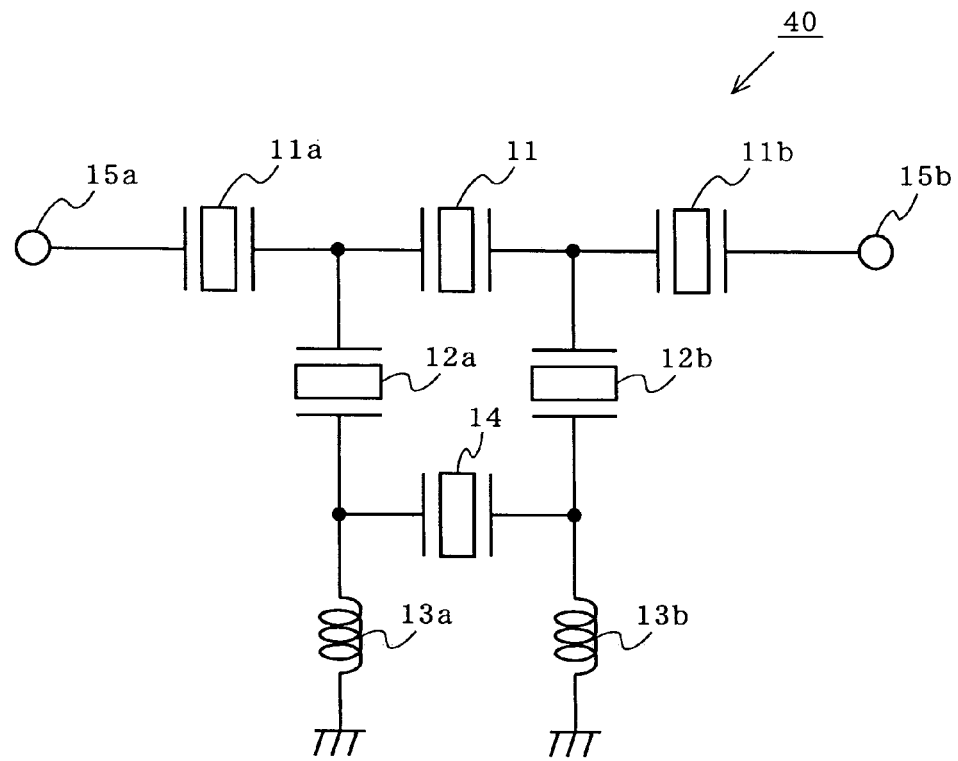
FIGS. 4A to 4C are circuit diagrams of filters which are applied versions of the filter 10 of FIG. 1.

In another configuration, as shown in FIG. 4A, a filter 40 may include a series piezoelectric resonator 11a inserted between an input terminal 15a and a first electrode of a parallel piezoelectric resonator 12a; and a series piezoelectric resonator 11b inserted between a first electrode of a parallel piezoelectric resonator 12b and an output terminal 15b. With the filter 40 too, by appropriately adjusting the resonance frequency of an additional piezoelectric resonator 14, a sufficient amount of attenuation can be obtained in desired frequency bands (attenuation bands).

Figure 4B:
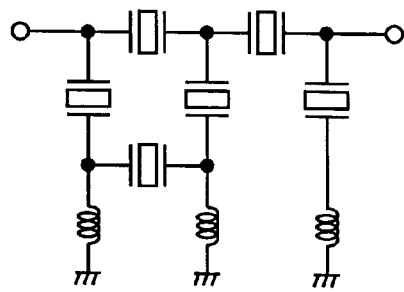
Figure 4C:
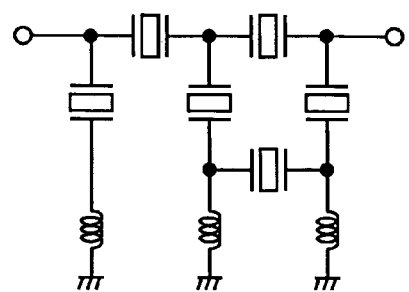

In still other configurations, as shown in FIGS. 4B and 4C, an additional piezoelectric resonator 14 may be inserted in a ladder filter having five piezoelectric resonators which include two series piezoelectric resonators inserted in series; and three parallel piezoelectric resonators inserted in parallel.

Second Embodiment

Figure 5A:
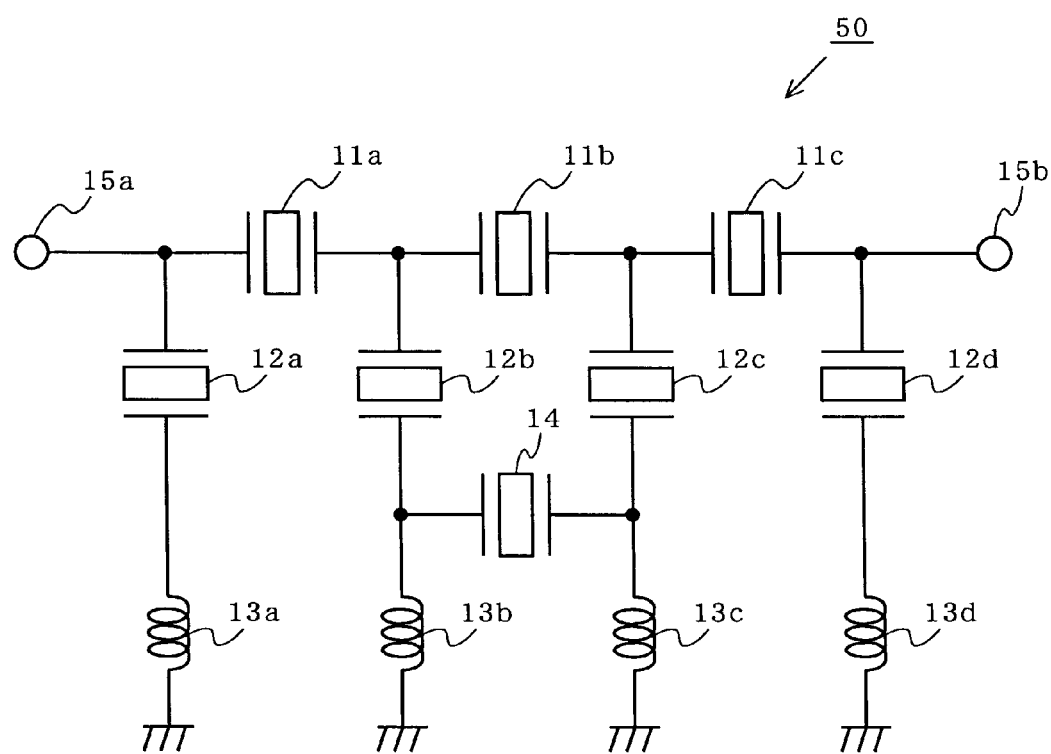
FIGS. 5A to 5F are circuit diagrams of a filter 50 using piezoelectric resonators, according to a second embodiment of the present invention.
Figure 5B:
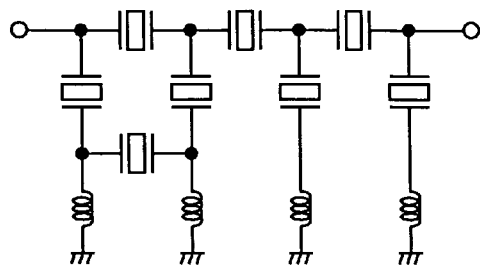
Figure 5C:
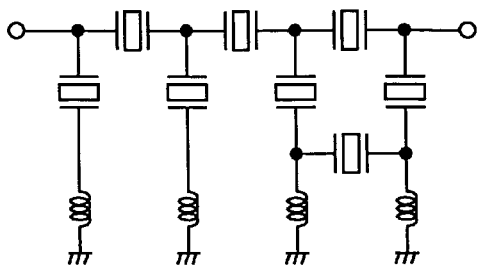
Figure 5D:
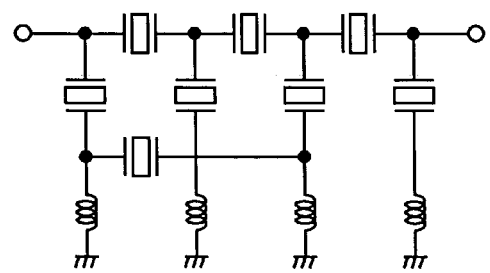
Figure 5E:
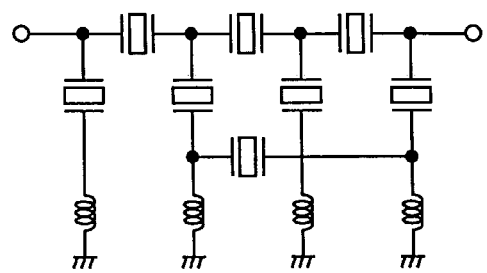
Figure 5F:
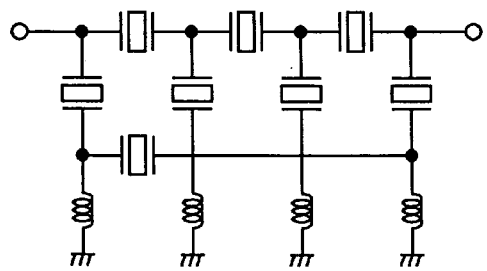

FIG. 5A is a circuit diagram of a filter 50 using piezoelectric resonators, according to a second embodiment of the present invention. In FIG. 5A, the filter 50 of the second embodiment includes three series piezoelectric resonators 11a to 11c; four parallel piezoelectric resonators 12a to 12d; four inductors 13a to 13d; and an additional piezoelectric resonator 14.

The series piezoelectric resonators 11a to 11c are connected in series between an input terminal 15a and an output terminal 15b. First electrodes of the parallel piezoelectric resonators 12a to 12d are connected to connection points between the input terminal 15a and the series piezoelectric resonator 11a, between the series piezoelectric resonators 11a and 11b, between the series piezoelectric resonators 11b and 11c, and between the series piezoelectric resonator 11c and the output terminal 15b, respectively. Second electrodes of the parallel piezoelectric resonators 12a to 12d are connected to first terminals of the inductors 13a to 13d, respectively. Second terminals of the inductors 13a to 13d are grounded. The additional piezoelectric resonator 14 is connected between the second electrode of the parallel piezoelectric resonator 12b and the second electrode of the parallel piezoelectric resonator 12c. Note that the additional piezoelectric resonator 14 can be connected between any two second electrodes of the parallel piezoelectric resonators 12a to 12d. That is, the connection pattern is not limited to that shown in FIG. 5A and other connection patterns, such as those shown in FIGS. 5B to 5F, may be employed.

As described above, by connecting the additional piezoelectric resonator 14 in the manner shown in FIG. 5A, the equivalent circuit of the series network shown in FIG. 2 can be added. Accordingly, by appropriately controlling the resonance frequency $f_0$, the attenuation band can be provided at any desired location.

As described above, in the filter 50 using piezoelectric resonators, according to the second embodiment of the present invention, an additional piezoelectric resonator is inserted between any two second electrodes of the parallel piezoelectric resonators. By this, while obtaining a desired amount of attenuation in the attenuation band, the passband width of the filter can be increased, whereby a loss in the passband can be improved compared to the conventional filter 250.

Figure 6A:
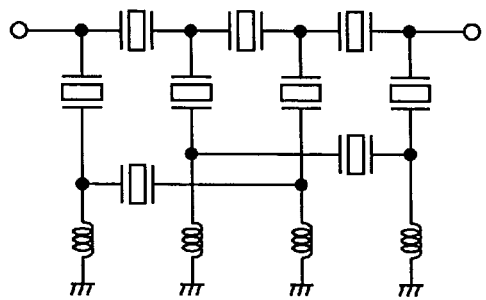
FIGS. 6A to 6C, 7A to 7X, 8A and 8B, 9, and 10 are circuit diagrams of filters which are equivalent to the filter 10 of FIG. 1.
Figure 6B:
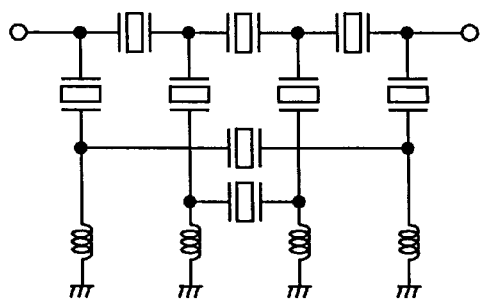
Figure 6C:
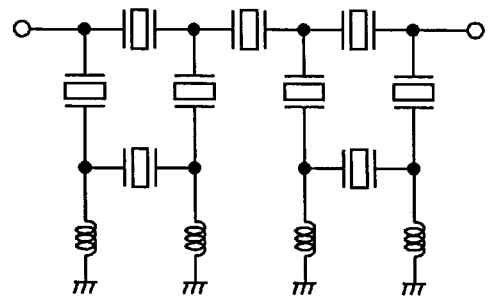
Figure 7I:
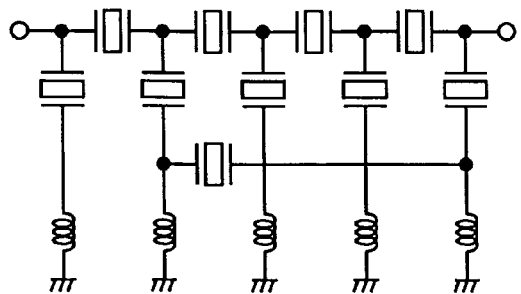
Figure 7J:
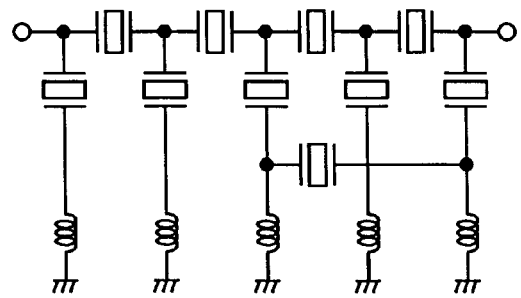
Figure 7K:
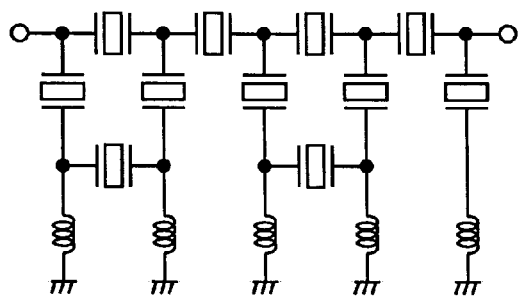
Figure 7L:
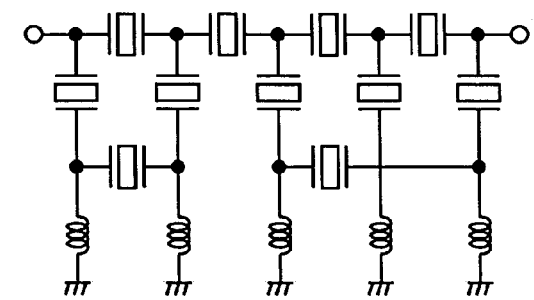
Figure 7M:
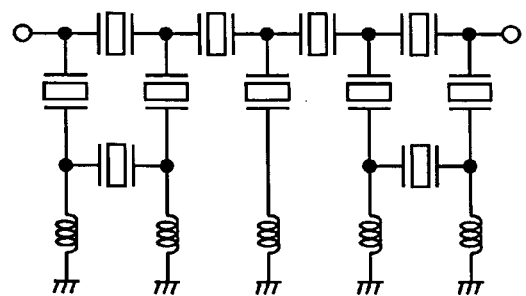
Figure 7N:
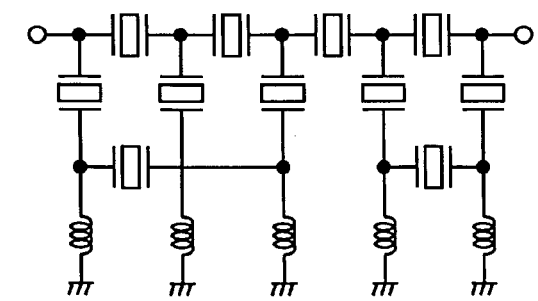
Figure 7O:
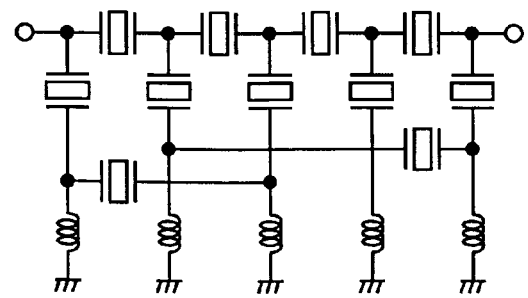
Figure 7P:
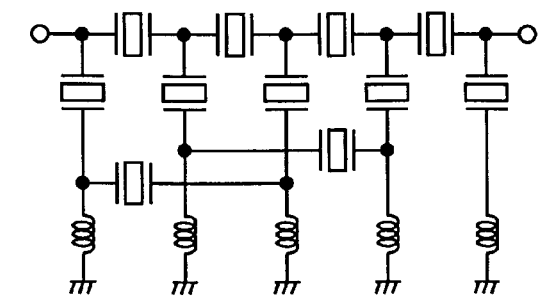
Figure 7Q:
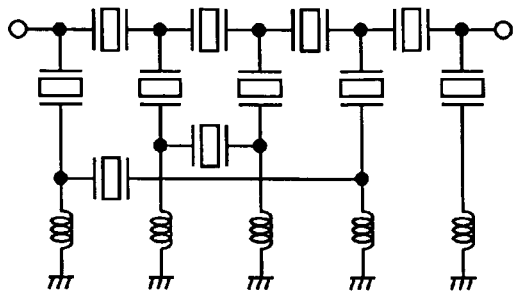
Figure 7R:
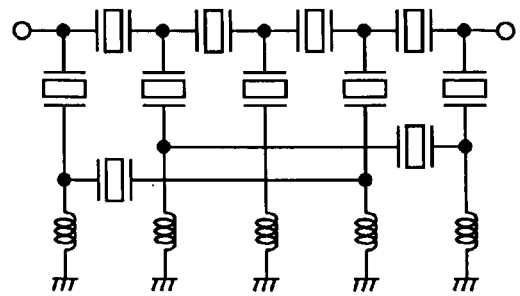
Figure 7S:
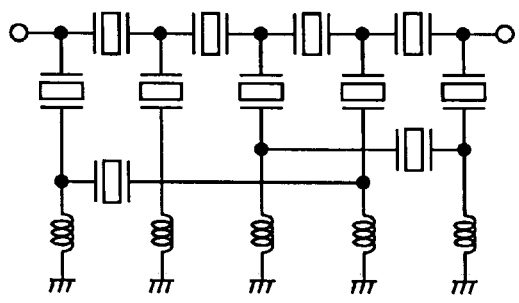
Figure 7T:
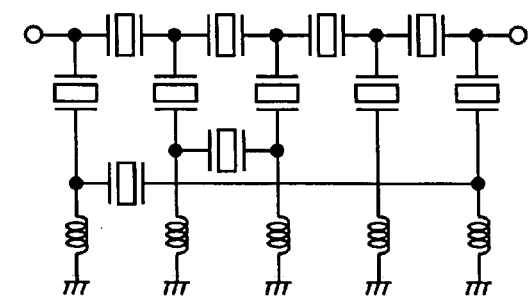
Figure 7U:
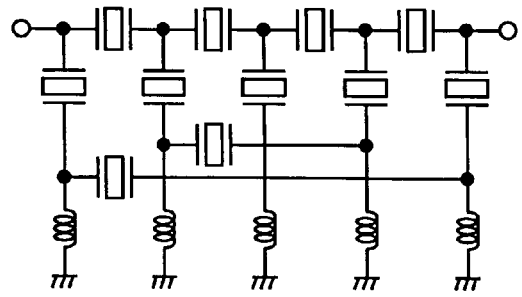
Figure 7V:
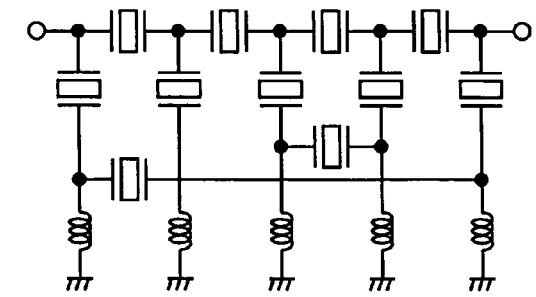
Figure 7W:
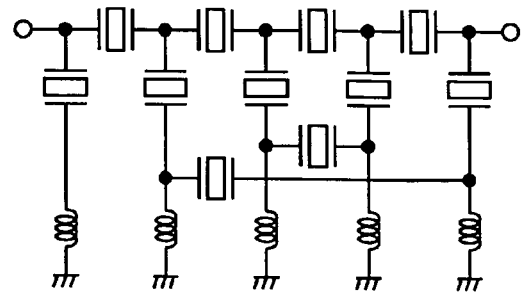
Figure 7X:
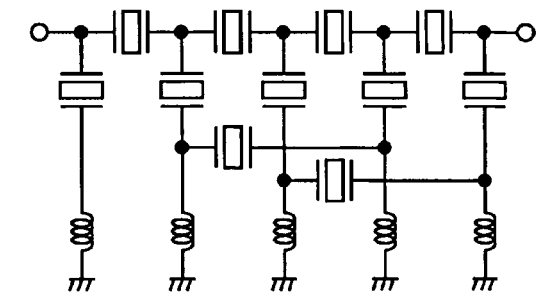

Note that although the second embodiment describes the case where a single additional piezoelectric resonator 14 is connected between any two second electrodes of the parallel piezoelectric resonators 12a to 12d, two additional piezoelectric resonators 14 may be connected under conditions where, as shown in FIGS. 6A to 6C, the two additional piezoelectric resonators each are connected between any two second electrodes of the parallel piezoelectric resonators 12a to 12d such that the connection points are not connected with each other.

Figure 8A:
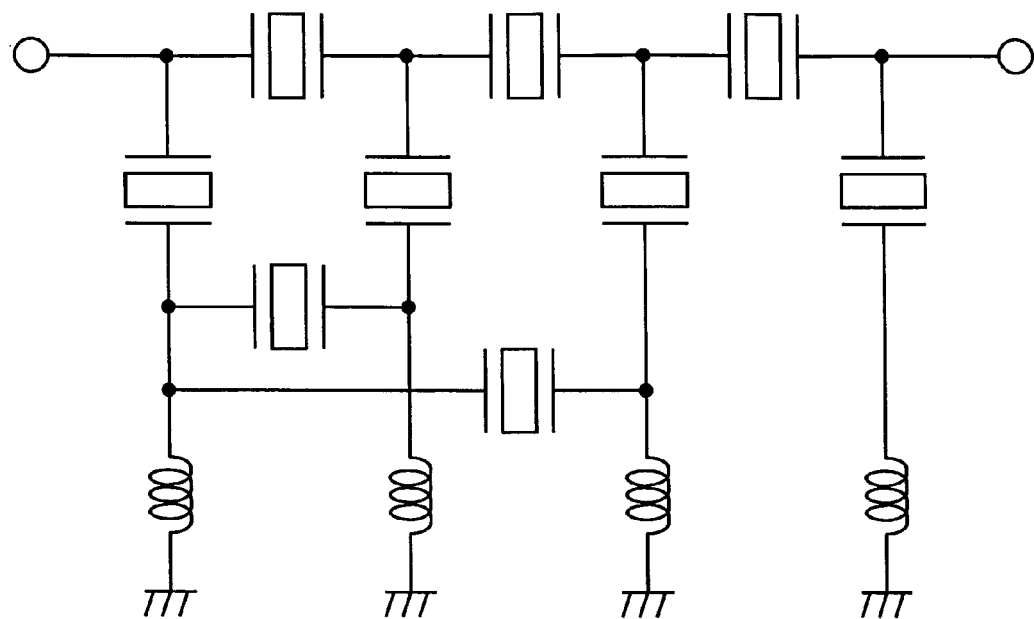
Figure 8B:
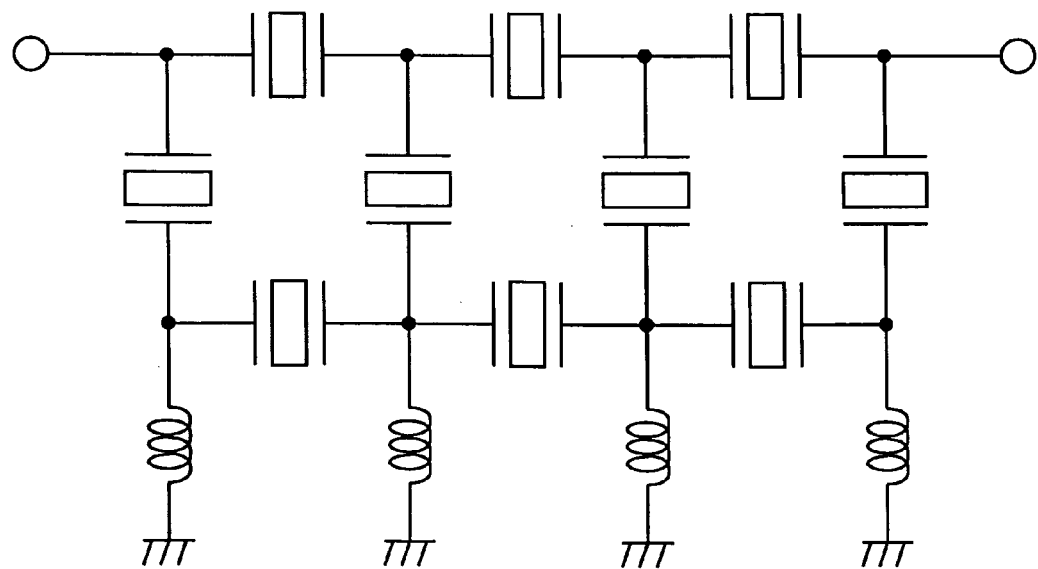

In addition, the number of additional piezoelectric resonators is not limited to one or two, and can be freely chosen depending on the desired band-pass characteristics, product size/cost, or the like. Further, the number of additional piezoelectric resonators to be connected to the parallel piezoelectric resonator is preferably one in terms of characteristics, as shown in circuits of FIGS. 5A to 5F, 6A to 6C, and 7A to 7X; however, a plurality of additional piezoelectric resonators may be connected to a single parallel piezoelectric resonator, as shown in circuits of FIGS. 8A and 8B. With this configuration too, by appropriately setting the material, thickness, size, etc., of the piezoelectric material layer, desired band-pass characteristics can be sufficiently obtained.

Figure 9:
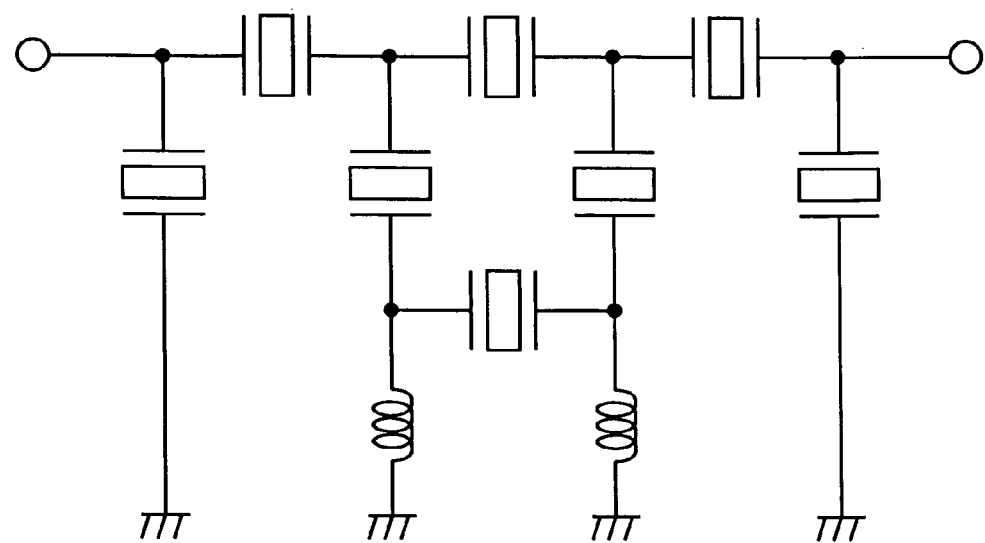
Figure 10:
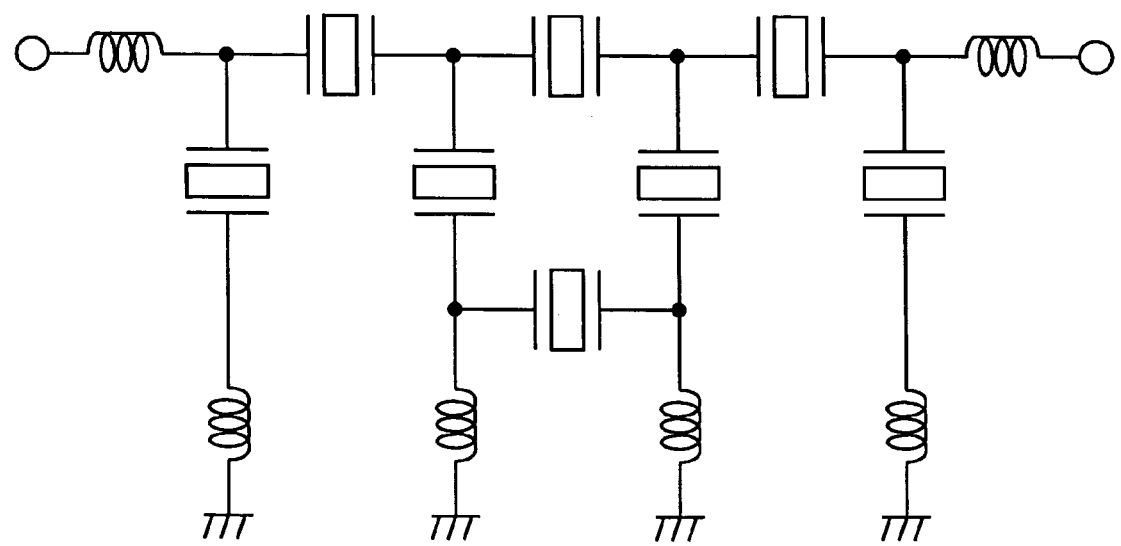
Figure 11A:
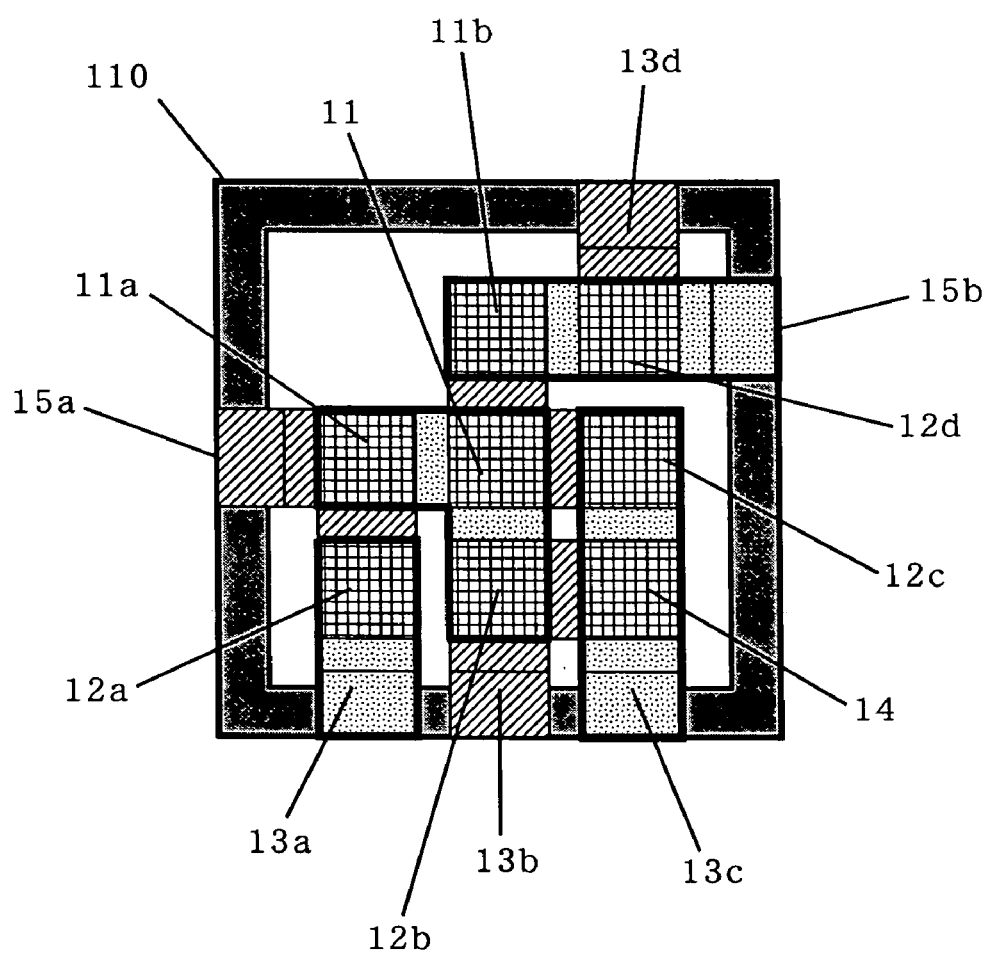
FIG. 11A is a top view of a semiconductor chip 110 having a circuit of the filter 50 shown in FIG. 5A.
Figure 11B:
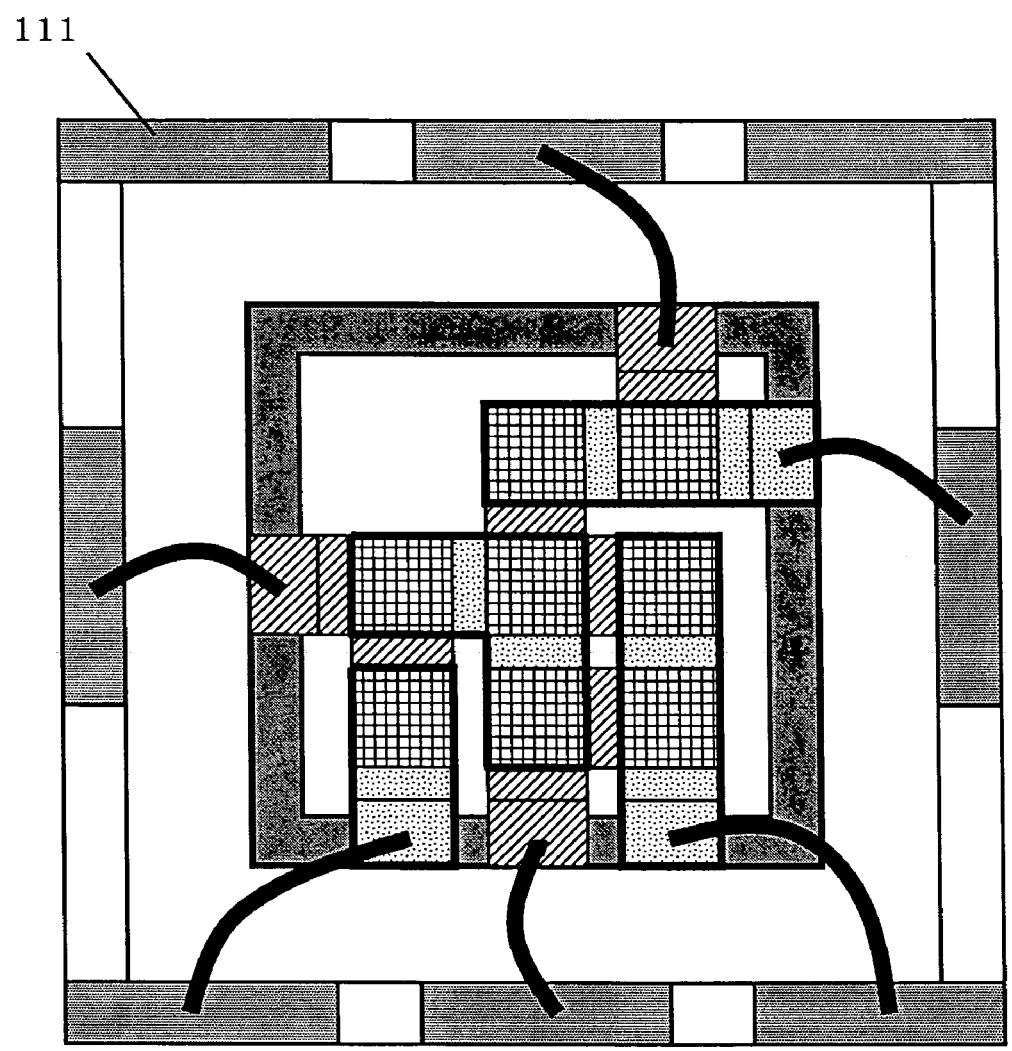
FIG. 11B is a top view of a semiconductor package 111 having the circuit of the filter 50 shown in FIG. 5A.

In the case of the filter configuration of the present invention, of the inductors 13a to 13d connected to the second electrodes of the parallel piezoelectric resonators 12a to 12d, inductors which do not have the additional piezoelectric resonator 14 connected thereto can be eliminated. Specifically, the second electrodes of the parallel piezoelectric resonators which do not have the additional piezoelectric resonator connected thereto may be directly grounded (see FIG. 9, for example). Alternatively, inductors may be inserted between an input terminal and a series piezoelectric resonator and between a series piezoelectric resonator and an output terminal (see FIG. 10, for example). Note that the values of the inductors included in the filter of the present invention can be reduced with respect to conventional filters (see FIG. 25, for example) by inserting an additional piezoelectric resonator. Since the filter of the present invention is normally formed on a semiconductor substrate, the inductors necessary for the filter can be formed using parasitic inductors such as electrodes, wiring, bonding wires, and bumps. An exemplary semiconductor chip 110 in which the inductors are formed using wiring is shown in FIG. 11A, and an exemplary semiconductor package 111 in which the inductors are formed using bonding wires is shown in FIG. 11B. A semiconductor chip having formed thereon a filter may be arranged on a printed circuit board or a low temperature co-fired ceramic (LTCC) substrate as necessary.

Third Embodiment

Figure 12:
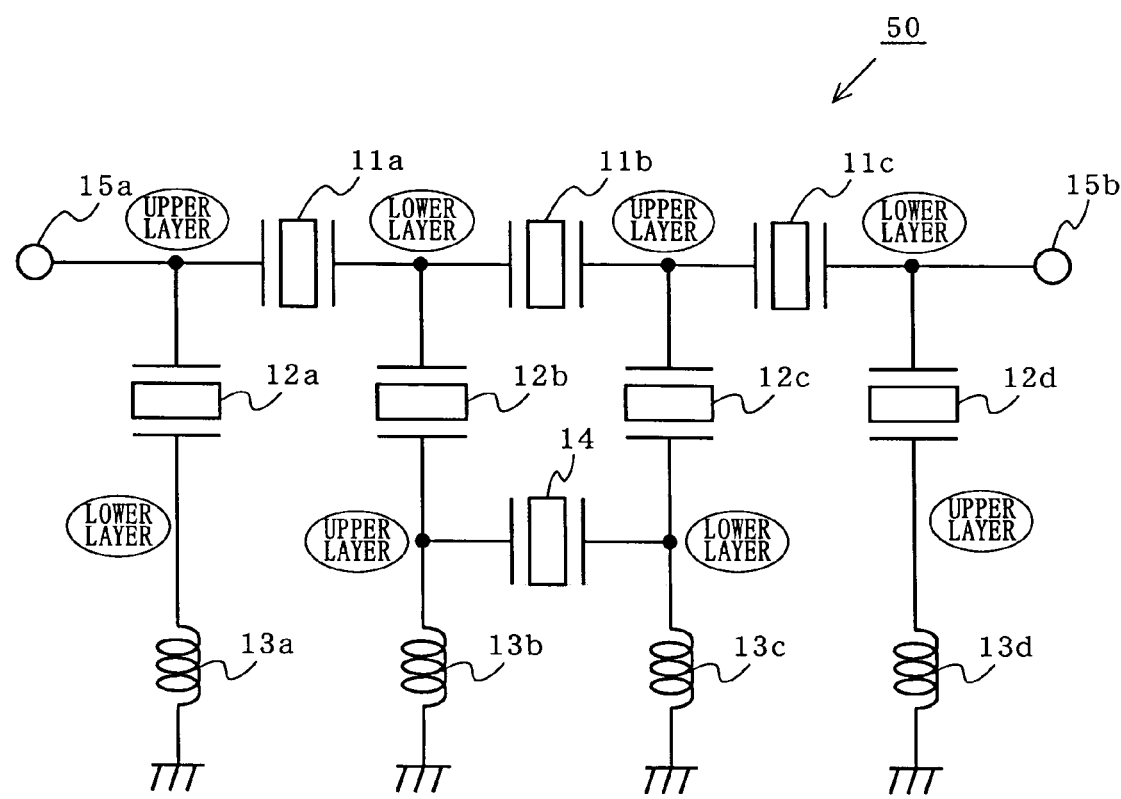
FIG. 12 is a diagram for describing a connection layer of each piezoelectric resonator of the semiconductor chip 110.

As described above, the filter circuits shown in the drawings are each configured such that piezoelectric resonators are connected to one another on a semiconductor substrate via their respective electrodes. The aforementioned FIG. 11A is a top view of the semiconductor chip 110 which includes the circuit of the filter 50 shown in FIG. 5A. In the drawing, the gridded areas represent the upper electrodes of the piezoelectric resonators 11a to 11c, 12a to 12d, and 14, the dotted areas represent upper-layer wiring, and the diagonally lined areas represent lower-layer wiring or the inductors 13a to 13d. In order to efficiently use the space, as is the semiconductor chip 110 of FIG. 11A, it is most effective to connect piezoelectric resonators such that each time a piezoelectric material layer is inserted, the layer of the connection to the electrode of the preceding piezoelectric resonator is alternated with the layer of the connection to the electrode of the following piezoelectric resonator, as shown in FIG. 12. Accordingly, by inserting the additional piezoelectric resonator 14 between the upper and lower layers, the chip design is facilitated.

In the example of FIG. 12, since the second electrode of the parallel piezoelectric resonator 12b is formed in the "upper layer" and the second electrode of the parallel piezoelectric resonator 12c is formed in the "lower layer", the insertion of the additional piezoelectric resonator 14 can be more easily done. On the other hand, the second electrodes of the parallel piezoelectric resonators 12a and 12c are formed in the same layer and the second electrodes of the parallel piezoelectric resonators 12b and 12d are formed in the same layer. Thus, in the case of inserting an additional piezoelectric resonator between electrodes in the same layer, it is necessary to short-circuit a part of the upper and lower electrode layers and connect between the upper and lower layers.

Figure 13:
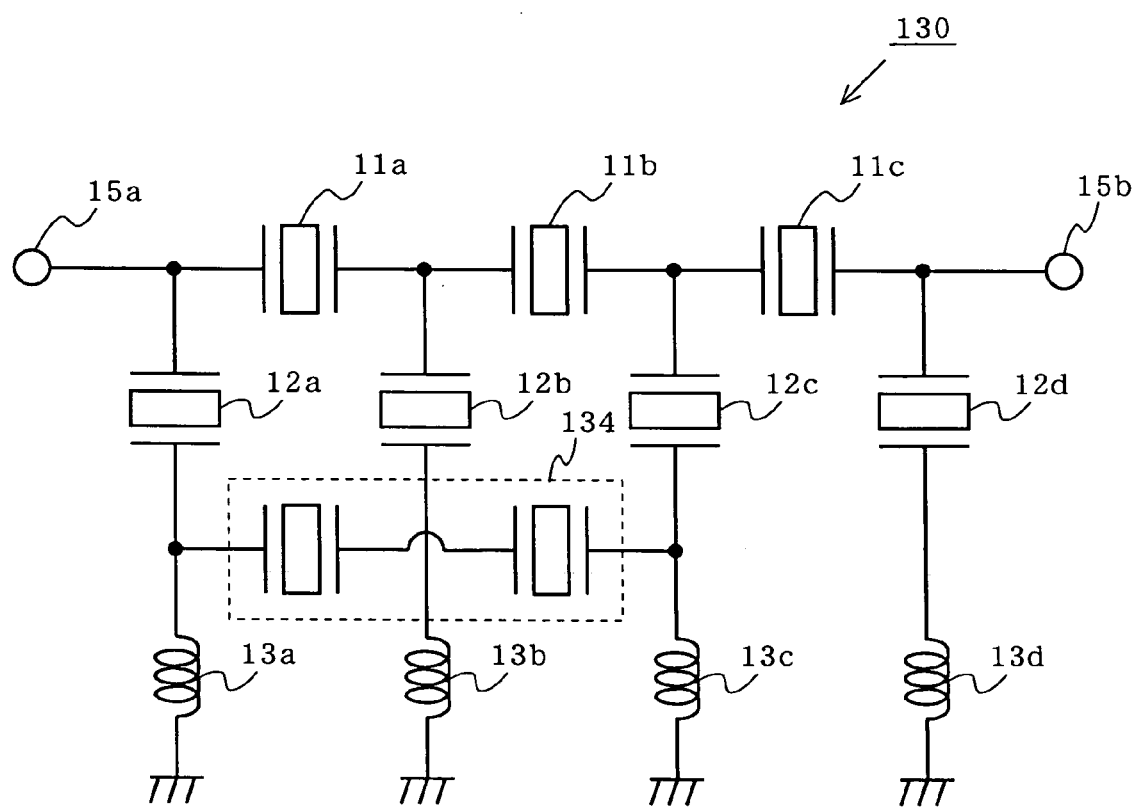
FIG. 13 is a circuit diagram of a filter 130 using piezoelectric resonators, according to a third embodiment of the present invention.
Figure 14:
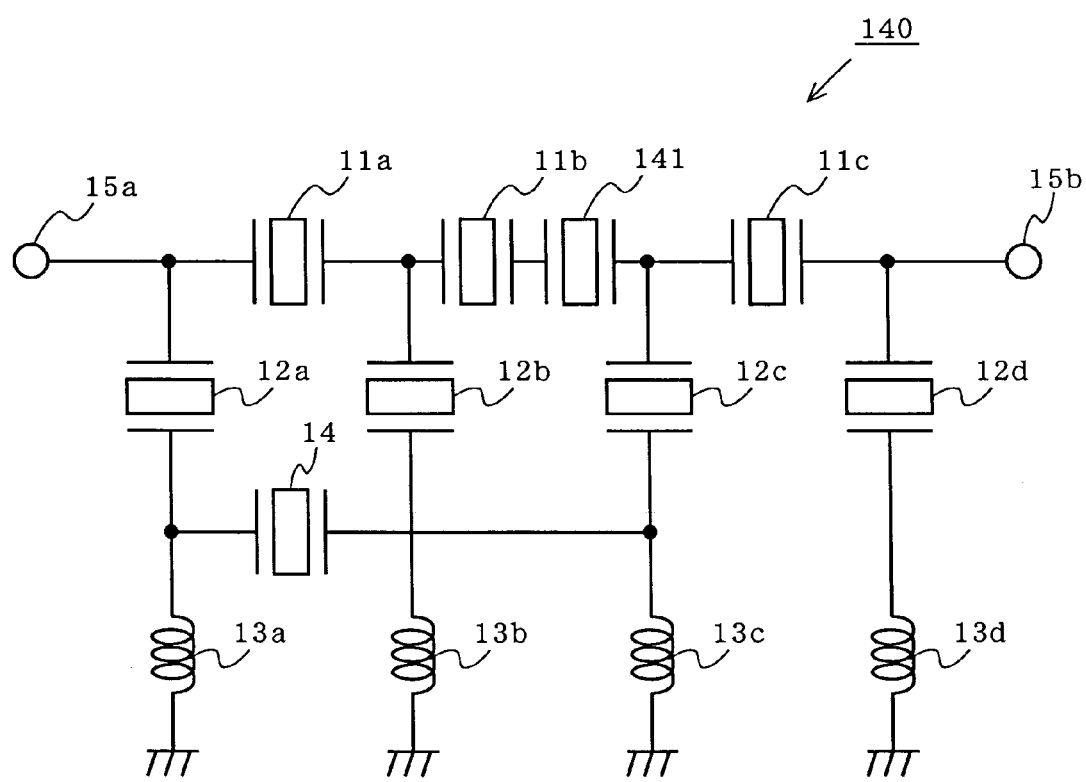
FIG. 14 is a circuit diagram of a filter 140 which is equivalent to the filter 130 of FIG. 13.

In view of this, the third embodiment describes a filter configuration which enables the insertion of an additional piezoelectric resonator between the upper and lower layers by adjusting the number of piezoelectric resonators. FIGS. 13 and 14 are exemplary circuit diagrams of a filter using piezoelectric resonators, according to the third embodiment, which employs such a configuration.

FIG. 13 is a diagram showing the configuration of a filter 130 using an additional piezoelectric resonator 134 having two piezoelectric resonators connected to each other in series. By this, even when the second electrodes of parallel piezoelectric resonators 12a and 12c are formed in the same layer, the additional piezoelectric resonator 134 can be inserted between the parallel piezoelectric resonators 12a and 12c. FIG. 14 is a diagram showing the configuration of a filter 140 in which a piezoelectric resonator 141 is further added on the series piezoelectric resonator side and the electrodes of an additional piezoelectric resonator 14 are made in different layers.

Figure 15:
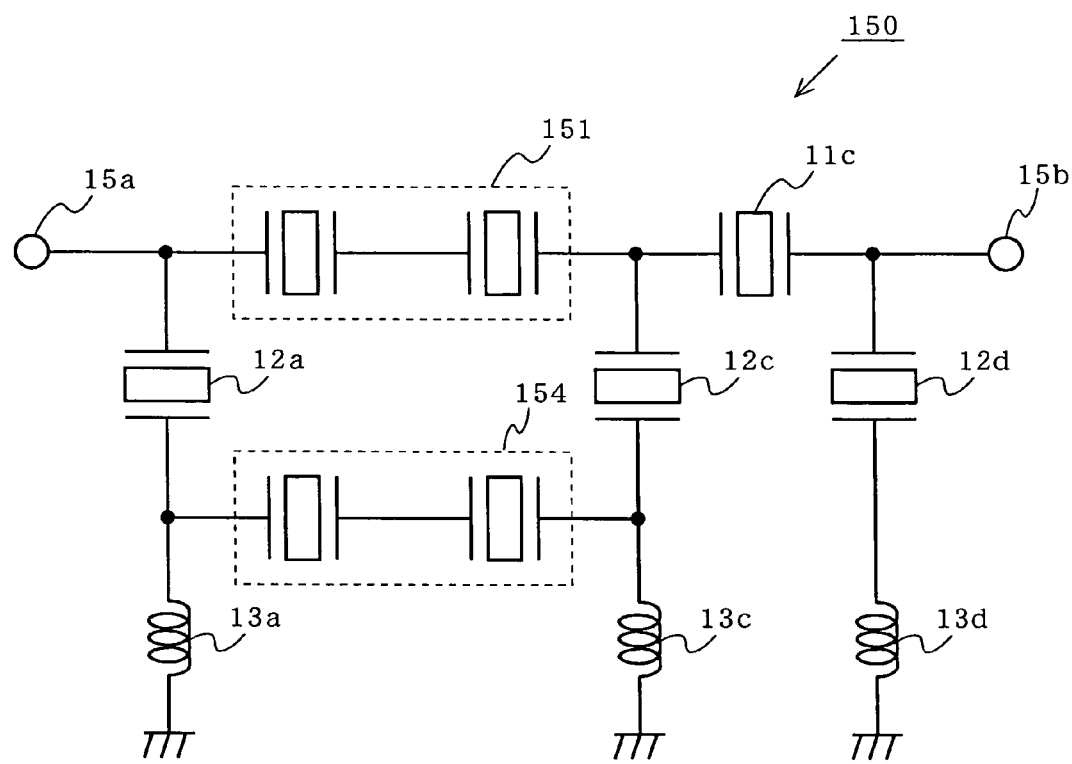
FIG. 15 is a circuit diagram of a filter 150 which is equivalent to the filter 130 of FIG. 13.

Note that even in the case where the electrodes of an additional piezoelectric resonator are originally made in different layers, the additional piezoelectric resonator can be configured in such a manner as that of a series piezoelectric resonator 151 or an additional piezoelectric resonator 154 shown in FIG. 15.

In this manner, by controlling the number of piezoelectric resonators to be included in the filter such that the number of additional piezoelectric resonators inserted in the filter and the number of series piezoelectric resonators between which the additional piezoelectric resonators are inserted share the same state of oddity or evenness, it becomes unnecessary to short-circuit a part of the upper and lower electrode layers to connect between the upper and lower layers.

(Structure 1 of Piezoelectric Resonator)

Figure 21:
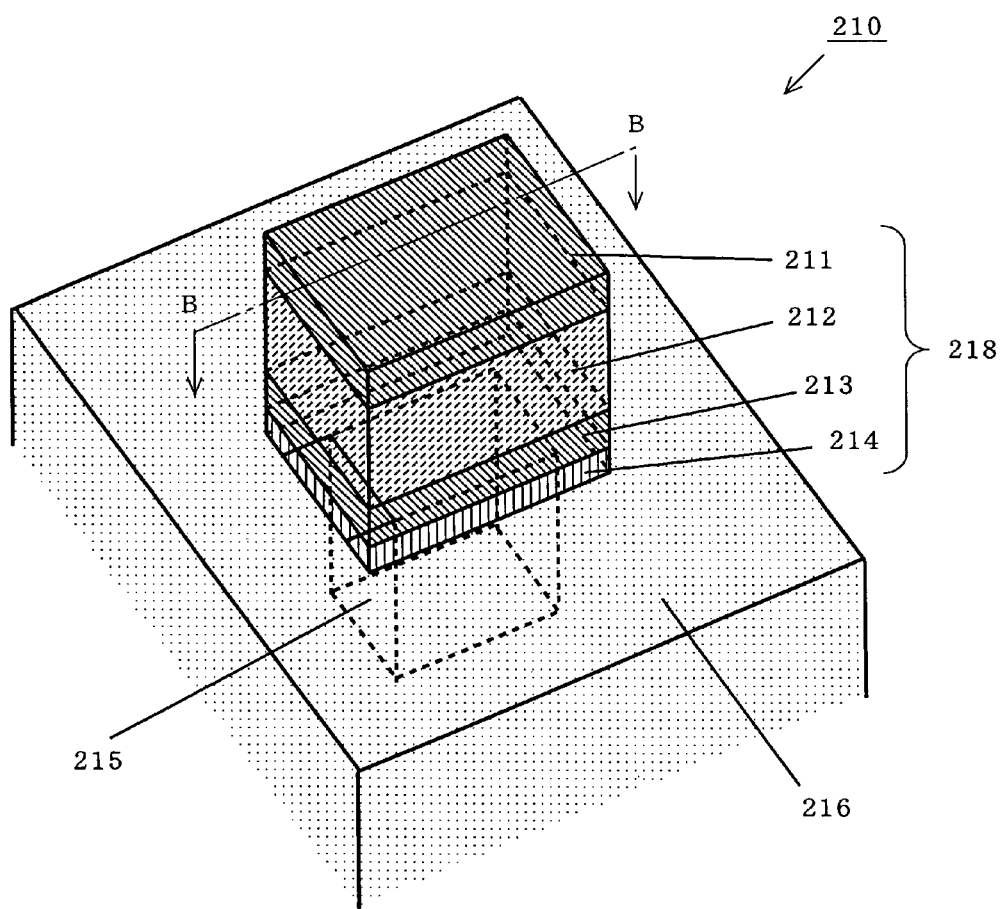
FIGS. 21 and 22 are perspective and cross-sectional views showing the basic structure of a piezoelectric resonator.

General structures of the series, parallel, and additional piezoelectric resonators to be used in the filter of each embodiment of the present invention are described in FIG. 21. In addition to this, another structure may be employed. A structure of a piezoelectric resonator other than that shown in FIG. 21 will be described below.

Figure 16:
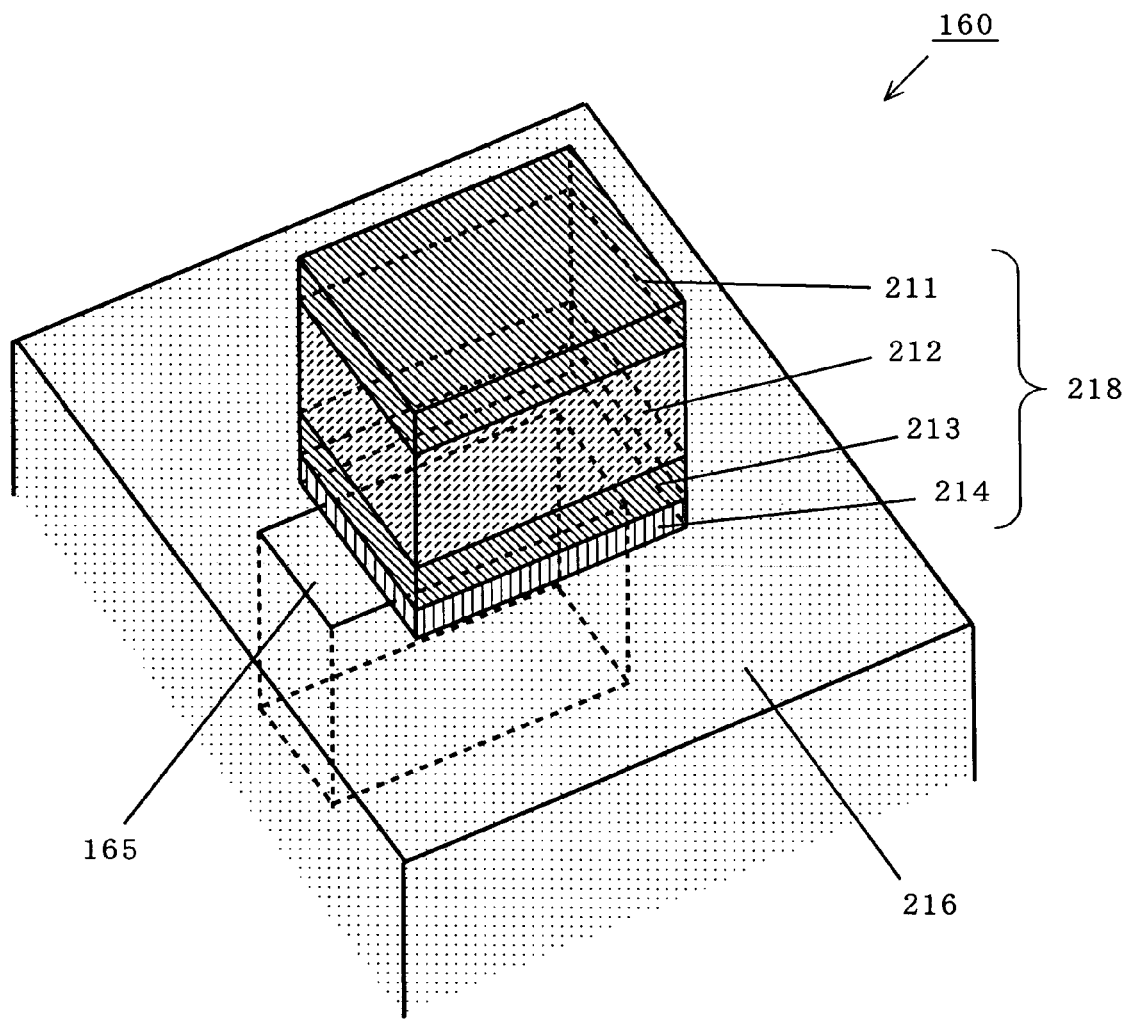
FIGS. 16 to 19 are perspective and cross-sectional views showing the structures of other piezoelectric resonators.

In FIG. 21, the cavity 215 is covered with the insulating material layer 214, however, as shown in FIG. 16, a cavity 165 may be provided so as not to be fully covered with an insulating material layer 214. With this structure, after depositing layers of a vibrating portion 218, a substance being filled in the cavity 165 can be removed by etching. Note that the cavity may be in any shape as long as the cavity does not hinder the vibration of the vibrating portion 218; for example, the opening of the cavity may be polygonal, circular, or elliptical shape, in addition to a quadrangular shape. Alternatively, the cavity may be tapered as viewed from the side surface. The cavity may be provided to penetrate through the lower part of the substrate 216.

Figure 17:
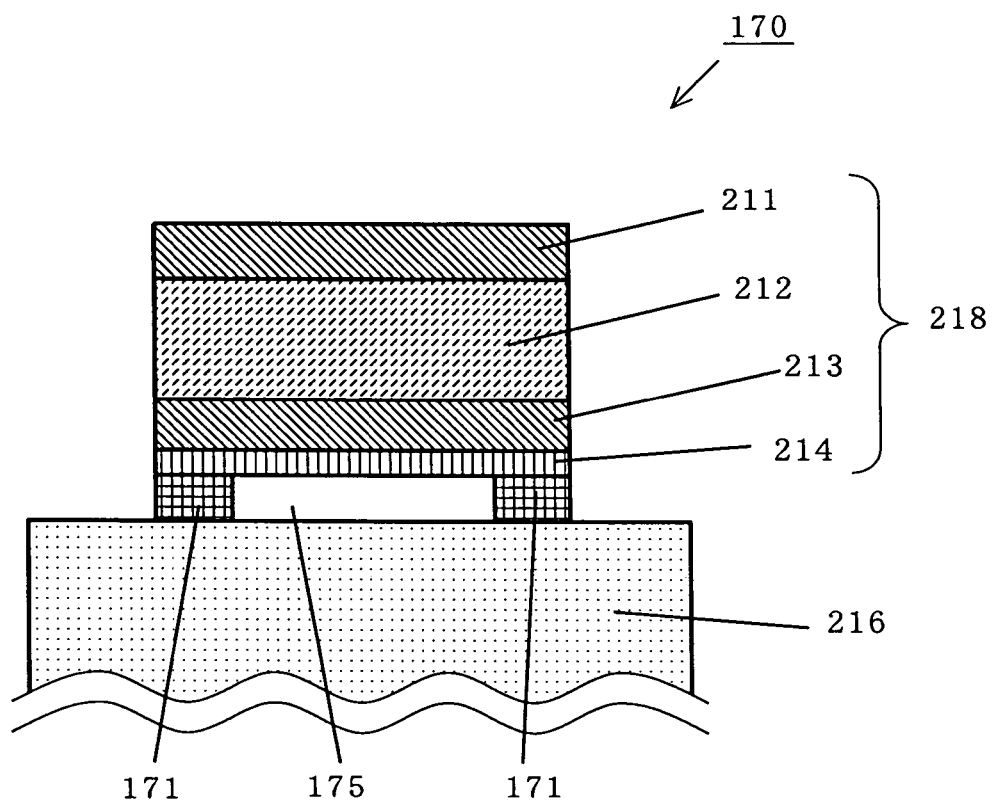
Figure 22:
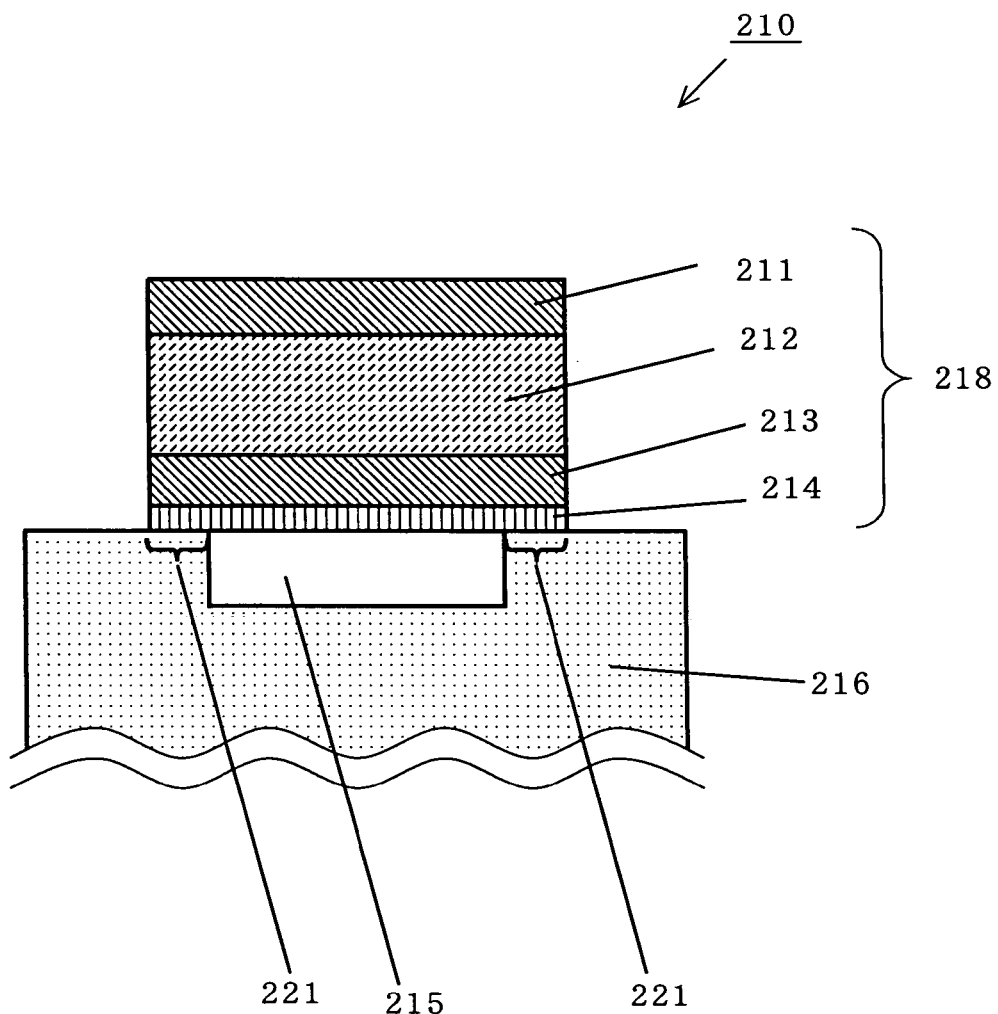
Figure 23A:
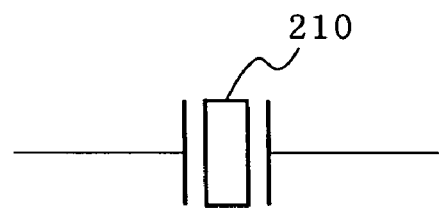
FIG. 23A is a diagram showing a circuit symbol of the piezoelectric resonator.
Figure 23B:
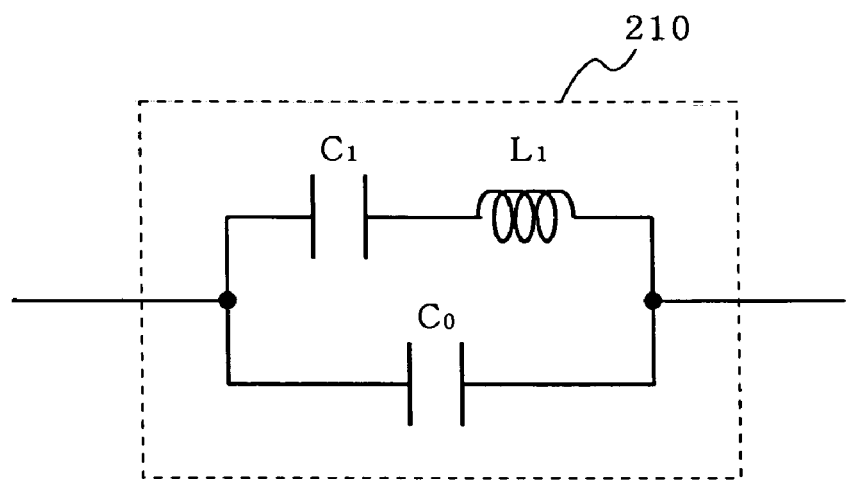
FIG. 23B is an equivalent circuit diagram of the piezoelectric resonator.
Figure 24:
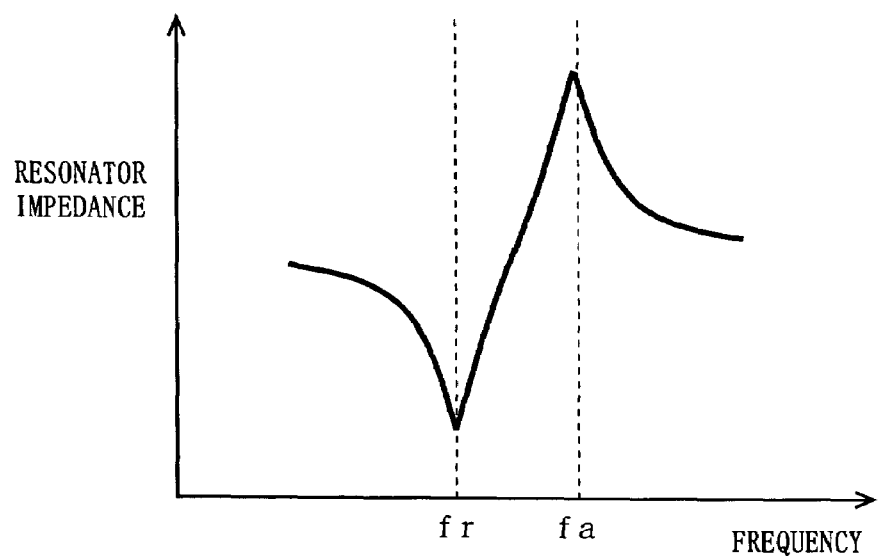
FIG. 24 is a diagram showing the frequency characteristics of the piezoelectric resonator.

Instead of providing the cavity 215 and providing the supporting portion 221 using a part of the substrate 216, as shown in FIG. 22, it is also possible to provide, as shown in FIG. 17, an independent supporting portion 171 on a substrate 216 and provide a cavity 175 for vibration of a vibrating portion 218.

Figure 18:
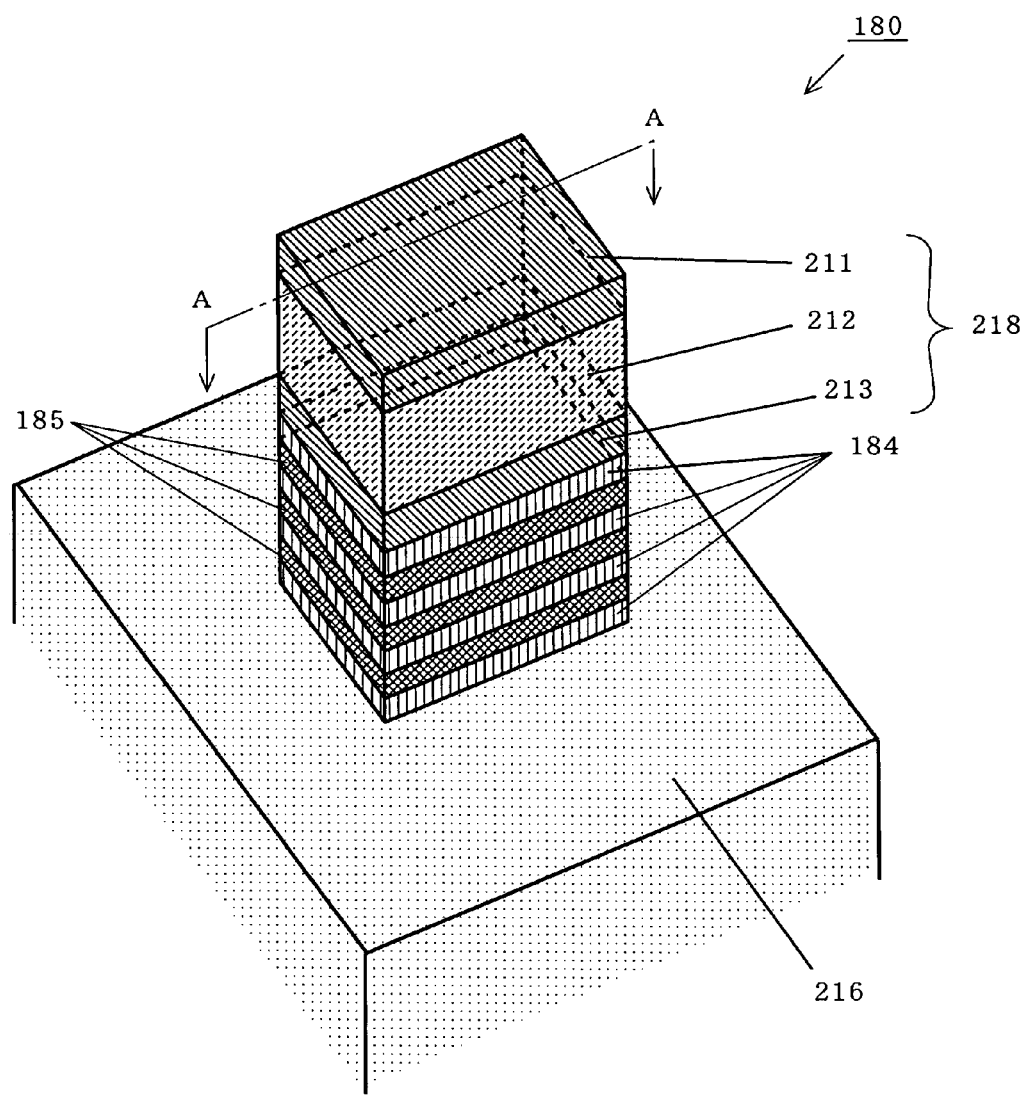
Figure 19:
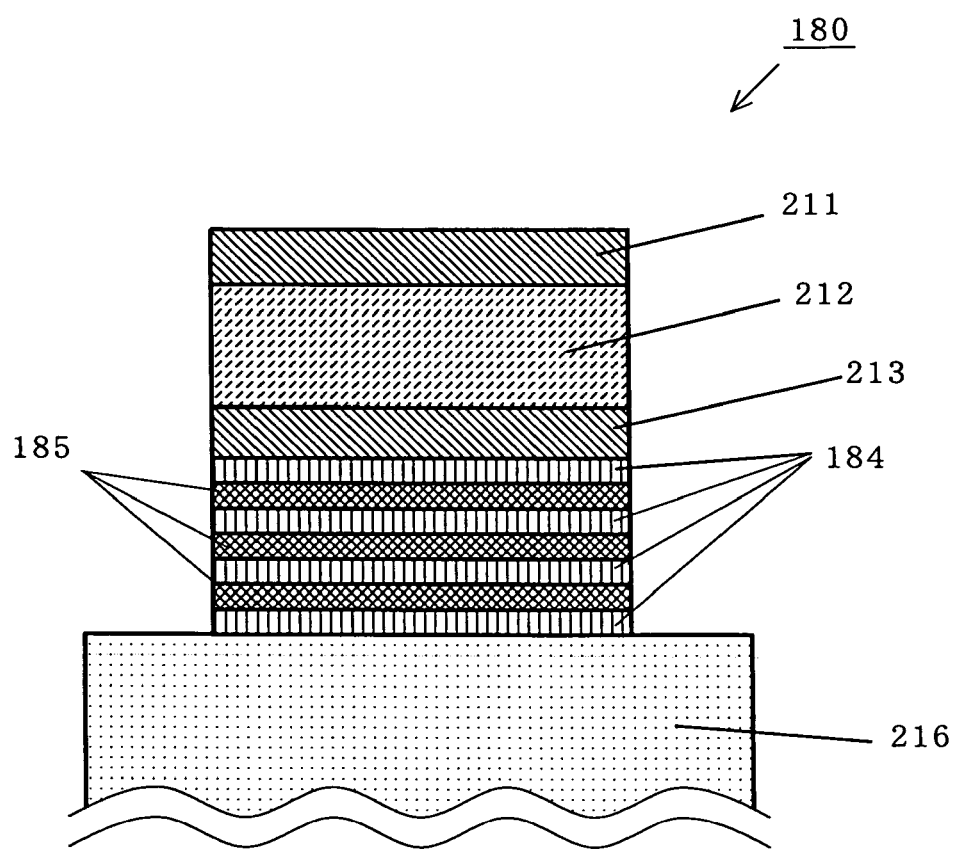

The configuration without a cavity is shown in FIGS. 18 and 19. A piezoelectric resonator 180 shown in FIGS. 18 and 19 is structured such that a vibrating portion 218 including an upper electrode layer 211, a lower electrode layer 213, and a piezoelectric material layer 212 sandwiched between the upper and lower electrode layers 211 and 213, is arranged on an acoustic multilayer film and the acoustic multilayer film is provided on a substrate 216. The acoustic multilayer film is formed by alternately stacking low acoustic impedance layers 184 and high acoustic impedance layers 185 each having a quarter-wavelength thickness. In this structure, the first layer of the acoustic multilayer film as viewed from the vibrating portion 218 is made using a low impedance layer 184 so that the load impedance with respect to the piezoelectric material layer 212 becomes sufficiently low, whereby the piezoelectric material layer 212 and the substrate 216 are acoustically isolated. With this structure, despite the fact that the vibrating portion 218 is fixed onto the substrate 216, the vibrating portion 218 approaches free-vibration conditions where the vibrating portion 218 is not supported by anything, and operates in the same manner as that of the piezoelectric resonator 210 of FIG. 21. The greater the number of stacked low impedance layers 184 and high impedance layers 185, the more the vibrating portion 218 is acoustically isolated from the substrate 216.

For the low impedance layer 184, a material such as silicon dioxide ($SiO_2$) or silicon nitride ($Si_3N_4$) may be used. For the high impedance layer 185, a material such as aluminum nitride (AlN), zinc oxide (ZnO), molybdenum (Mo), hafnium oxide ($HfO_2$), titanium oxide ($TiO_2$), or zirconium oxide ($ZrO_2$) may be used.

Note that the layer configuration of the piezoelectric resonator 210 is merely an example; even if a thin piezoelectric material layer is provided as a passivation film over the upper electrode, or even if an insulating layer is provided between the piezoelectric material layer and the electrode, the same advantage as that obtained by the piezoelectric resonator 210 can be obtained. Thus, the components of the present invention are not limited to those of the piezoelectric resonator 210.

The upper electrode layer 211, the piezoelectric material layer 212, the lower electrode layer 213, and the insulating material layer 214 which make up the vibrating portion 218 may have different sizes in area. In addition, all layers of each piezoelectric resonator, except the upper electrode layer 211 and the lower electrode layer 213, may be formed integrally.

For the electrode shape, as is the cavity shape, regardless of what shape the electrode takes (e.g., circular, polygonal, or constricted), the same advantage can be obtained.

(Structure 2 of Piezoelectric Resonator)

Figure 20:
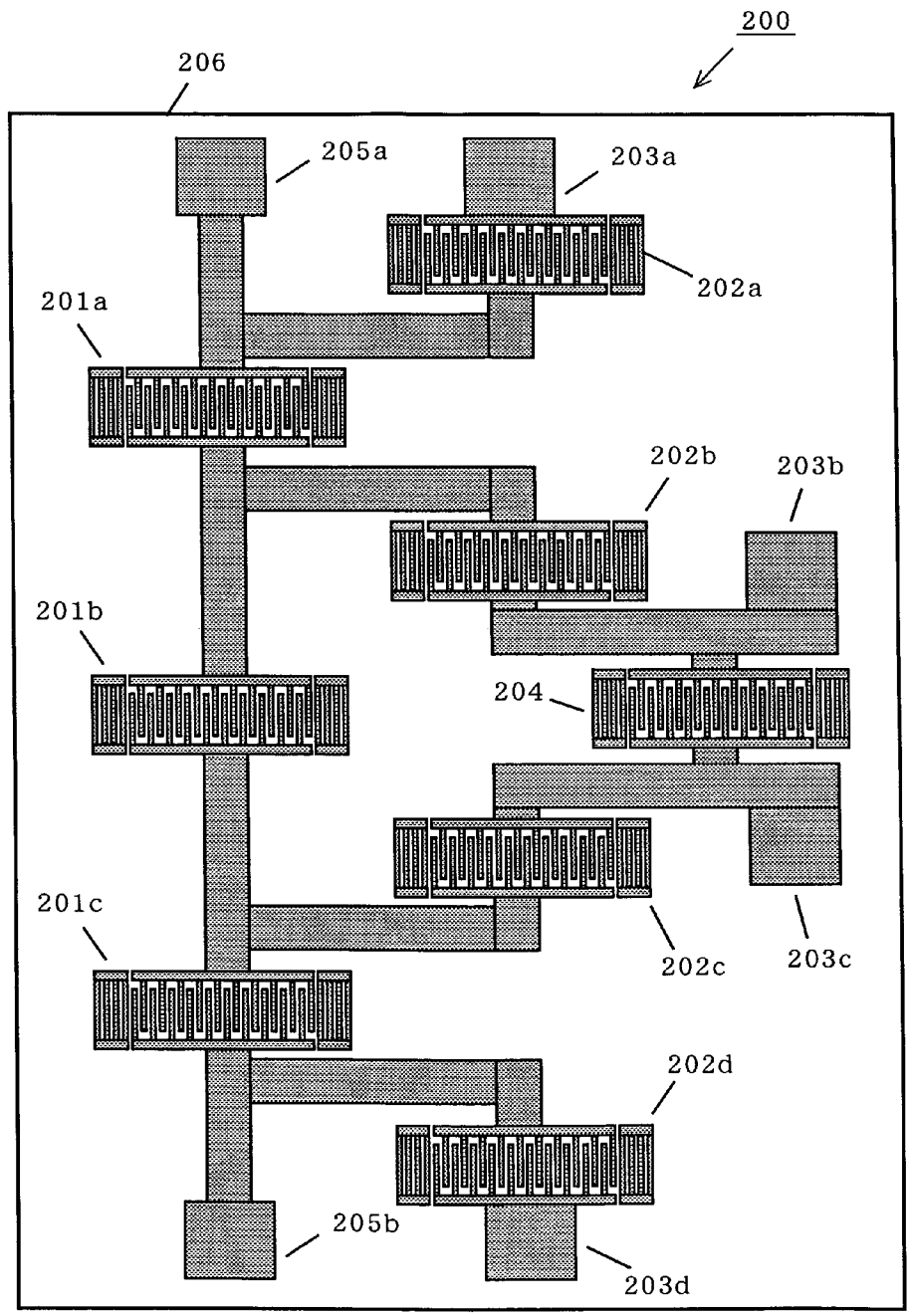
FIG. 20 is a diagram showing an exemplary surface acoustic wave filter 200 using surface acoustic wave resonators as piezoelectric resonators.

FIG. 20 is a diagram showing an exemplary surface acoustic wave filter 200 using surface acoustic wave resonators as the piezoelectric resonators of the filter 10 according to the foregoing first embodiment. A surface acoustic wave resonator is formed such that an interdigital transducer electrode and a reflector electrode are arranged on a piezoelectric substrate 206 so as to be close to each other with respect to the propagation direction. The surface acoustic wave filter 200 is configured such that series surface acoustic wave resonators 201a to 201c, parallel surface acoustic wave resonators 202a to 202d, and an additional surface acoustic wave resonator 204 are formed on the piezoelectric substrate 206 and these resonators are connected to one another by wired electrodes on the piezoelectric substrate 206. The resonance frequencies of the surface acoustic wave resonators are optimally set by adjusting an electrode finger pitch, a metalization ratio, the thickness of an electrode film, or the like, so as to obtain desired filter characteristics. A first electrode pad 205a is connected to one of the input and output terminals through an inductance component, and a second electrode pad 205b is connected to the other one of the input and output terminals through an inductance component. Ground electrode pads 203a to 203d are connected to the parallel surface acoustic wave resonators 202a to 202d and grounded through inductance components. Further, the additional surface acoustic wave resonator 204 is connected between ground electrode pads 203b and 203c.

While the invention has been described in detail, the foregoing description is in all aspects illustrative and not restrictive. It is understood that numerous other modifications and variations can be devised without departing from the scope of the invention.

What is claimed is:

1. A filter comprising:
a series piezoelectric resonator part including at least one series piezoelectric resonator having electrodes, the series piezoelectric resonator being connected in series between an input terminal of the filter and an output terminal of the filter;
a parallel piezoelectric resonator part including at least two parallel piezoelectric resonators each having a first electrode and a second electrode, the parallel piezoelectric resonators being connected, via the first electrodes, in parallel to the series piezoelectric resonator and in a ladder configuration;
an inductor part including inductors having electrodes, the inductors being provided to at least two of the parallel piezoelectric resonators, respectively, the inductors each connecting between a ground and the second electrode of the respective parallel piezoelectric resonator; and
an additional piezoelectric resonator part including at least one additional piezoelectric resonator having a first electrode and a second electrode, the first and second electrodes being respectively connected to the second electrodes of any two of the parallel piezoelectric resonators having the inductors connected thereto.

2. The filter according to claim 1, wherein
the series piezoelectric resonator part includes a series piezoelectric resonator having a first electrode and a second electrode, and being connected in series between the input and output terminals,
the parallel piezoelectric resonator part includes:
a first parallel piezoelectric resonator having a first electrode and a second electrode, the first electrode being connected to the first electrode of the series piezoelectric resonator; and
a second parallel piezoelectric resonator having a first electrode and a second electrode, the first electrode being connected to the second electrode of the series piezoelectric resonator,
the inductor part includes:
a first inductor connected between the second electrode of the first parallel piezoelectric resonator and the ground; and
a second inductor connected between the second electrode of the second parallel piezoelectric resonator and the ground, and
the additional piezoelectric resonator part includes an additional piezoelectric resonator connected between the second electrode of the first parallel piezoelectric resonator and the second electrode of the second parallel piezoelectric resonator.

3. The filter according to claim 2, wherein the number of the series piezoelectric resonators is equal to the number of the additional piezoelectric resonators.

4. The filter according to claim 1, wherein
the series piezoelectric resonator part includes a first series piezoelectric resonator and a second series piezoelectric resonator which are connected in series between the input and output terminals, —the first and second series piezoelectric resonators each having a first electrode and a second electrode,
the parallel piezoelectric resonator part includes:
a first parallel piezoelectric resonator having a first electrode and a second electrode, the first electrode being connected to the first electrode of the first series piezoelectric resonator;
a second parallel piezoelectric resonator having a first electrode and a second electrode, the first electrode being connected between the second electrode of the first series piezoelectric resonator and the first electrode of the second series piezoelectric resonator;
a third parallel piezoelectric resonator having a first electrode and a second electrode, the first electrode being connected to the second electrode of the second series piezoelectric resonator,
the inductor part includes:
a first inductor connected between the second electrode of the first parallel piezoelectric resonator and the ground; and
a second inductor connected between the second electrode of the third parallel piezoelectric resonator and the ground, and
the additional piezoelectric resonator part includes an additional piezoelectric resonator connected between the second electrode of the first parallel piezoelectric resonator and the second electrode of the third parallel piezoelectric resonator.

5. The filter according to claim 4, further comprising a plurality of the first and second series piezoelectric resonators and a plurality of the additional piezoelectric resonator, wherein the plurality of first and second series piezoelectric resonators and the plurality of additional piezoelectric resonators are all provided in odd numbers or all provided in even numbers.

6. The filter according to claim 1, wherein
the series piezoelectric resonator part includes a first series piezoelectric resonator, a second series piezoelectric resonator and a third series piezoelectric resonator which are connected in series between the input and output terminals, the first, second and third series piezoelectric resonators each having a first electrode and a second electrode,
the parallel piezoelectric resonator part includes:
a first parallel piezoelectric resonator having a first electrode and a second electrode, the first electrode being connected to the first electrode of the first series piezoelectric resonator;
a second parallel piezoelectric resonator having a first electrode and a second electrode, the first electrode being connected between the second electrode of the first series piezoelectric resonator and the first electrode of the second series piezoelectric resonator;
a third parallel piezoelectric resonator having a first electrode and a second electrode, the first electrode being connected between the second electrode of the second series piezoelectric resonator and the first electrode of the third series piezoelectric resonator; and
a fourth parallel piezoelectric resonator having a first electrode and a second electrode, the first electrode being connected to the second electrode of the third series piezoelectric resonator,
the inductor part includes:
a first inductor connected between the second electrode of the first parallel piezoelectric resonator and the ground;
a second inductor connected between the second electrode of the second parallel piezoelectric resonator and the ground;
a third inductor connected between the second electrode of the third parallel piezoelectric resonator and the ground; and
a fourth inductor connected between the second electrode of the fourth parallel piezoelectric resonator and the ground, and
the additional piezoelectric resonator part includes:
a first additional piezoelectric resonator connected between the second electrode of the first parallel piezoelectric resonator and the second electrode of the n-th parallel piezoelectric resonator, where n is one of the numbers 2, 3 and 4; and
a second additional piezoelectric resonator connected between the second electrodes of any two of the parallel piezoelectric resonators other than the first and n-th parallel piezoelectric resonators.

7. The filter according to claim 1, wherein the series piezoelectric resonator, the parallel piezoelectric resonators, and the additional piezoelectric resonator are thin-film acoustic wave resonators.

8. The filter according to claim 7, wherein the thin-film acoustic wave resonators each include: an upper electrode; a lower electrode; a piezoelectric material layer sandwiched between the upper and lower electrodes; and a cavity provided under the lower electrode.

9. The filter according to claim 7, wherein the thin-film acoustic wave resonators each include: an upper electrode; a lower electrode; a piezoelectric material layer sandwiched between the upper and lower electrodes; and an acoustic multilayer film provided under the lower electrode, the acoustic multilayer film comprising a low impedance layer and a high impedance layer alternately stacked.

10. The filter according to claim 8, wherein connections between the electrodes of the series piezoelectric resonator, the parallel piezoelectric resonators, and the additional piezoelectric resonator and electrodes of their respective adjacent piezoelectric resonators in an equivalent circuit are located in a same wiring layer.

11. The filter according to claim 9, wherein connections between the electrodes of the series piezoelectric resonator, the parallel piezoelectric resonators, and the additional piezoelectric resonator and electrodes of their respective adjacent piezoelectric resonators in an equivalent circuit are located in a same wiring layer.

12. The filter according to claim 1, wherein the series piezoelectric resonator, the parallel piezoelectric resonators, and the additional piezoelectric resonator are surface acoustic wave resonators.

13. The filter according to claim 12, wherein the surface acoustic wave resonators each include: a piezoelectric substrate; an interdigital transducer electrode; and a reflector electrode, wherein the interdigital transducer electrode and the reflector electrode are located on the piezoelectric substrate so as to be close to each other with respect to a propagation direction.

* * * * *